United States Patent
Chang et al.

(10) Patent No.: US 7,563,701 B2
(45) Date of Patent: Jul. 21, 2009

(54) SELF-ALIGNED CONTACTS FOR TRANSISTORS

(75) Inventors: Peter L. D. Chang, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 332 days.

(21) Appl. No.: 11/097,429

(22) Filed: Mar. 31, 2005

(65) Prior Publication Data
US 2006/0223302 A1 Oct. 5, 2006

(51) Int. Cl.
*H01L 21/44* (2006.01)

(52) U.S. Cl. ............................. 438/597; 257/E21.507; 438/622

(58) Field of Classification Search ................ 438/229, 438/597, 622; 257/E21.507
See application file for complete search history.

(56) References Cited

U.S. PATENT DOCUMENTS

| | | | |
|---|---|---|---|
| 4,906,589 A | | 3/1990 | Chao |
| 5,346,839 A | | 9/1994 | Sundaresan |
| 5,466,621 A | | 11/1995 | Hisamoto et al. |
| 5,578,513 A | | 11/1996 | Maegawa |
| 5,595,919 A | | 1/1997 | Pan |
| 5,658,806 A | | 8/1997 | Lin et al. |
| 5,682,048 A | * | 10/1997 | Shinohara et al. ........... 257/342 |
| 5,701,016 A | | 12/1997 | Burroughes et al. |
| 5,716,879 A | | 2/1998 | Choi et al. |
| 5,827,769 A | | 10/1998 | Aminzadeh et al. |
| 6,022,815 A | | 2/2000 | Doyle et al. |
| 6,054,355 A | | 4/2000 | Inumiya et al. |
| 6,144,072 A | | 11/2000 | Iwamatsu et al. |
| 6,153,485 A | * | 11/2000 | Pey et al. .................... 438/305 |
| 6,165,880 A | * | 12/2000 | Yaung et al. ................ 438/592 |
| 6,228,691 B1 | | 5/2001 | Doyle |
| 6,251,729 B1 | | 6/2001 | Montree et al. |
| 6,396,108 B1 | | 5/2002 | Krivokapic et al. |
| 6,483,156 B1 | | 11/2002 | Adkission et al. |

(Continued)

OTHER PUBLICATIONS

T. Miyashita, et al., "A Novel Bit-line Process using Poly-Si Masked Dual-Damascene (PMDD) for 0.13μm DRAMs and Beyond," IEEE, pp. 15.4.1 to 15.4.4 (2000).

(Continued)

*Primary Examiner*—Asok K Sarkar
(74) *Attorney, Agent, or Firm*—Blakely, Sokoloff, Taylor & Zafman LLP

(57) ABSTRACT

Self-aligned contacts for transistors and methods for fabricating the contacts are described. An etch resistant material is patterned to create an opening that resides above a transistor gate structure. A selective etch is performed through the opening that does not etch the transistor gate structure but does etch material that resides laterally with respect to the transistor gate structure in order to expose tops, immediately adjacent to the transistor gate structure, of drain and source regions of a diffusion layer of the transistor. Conductive material is deposited that covers respective tops of the drain and source regions of the diffusion layer of the transistor to a depth that does not short the drain and source region of the diffusion layer of the transistor. A layer above the conductive material is formed. Contacts are formed through the layer above the conductive material to respective portions of the conductive material that cover respective tops of the drain and source regions of the diffusion layer of the transistor.

17 Claims, 27 Drawing Sheets

U.S. PATENT DOCUMENTS

| | | |
|---|---|---|
| 6,498,096 B2 | 12/2002 | Bruce et al. |
| 6,501,141 B1 | 12/2002 | Leu |
| 6,534,807 B2 | 3/2003 | Mandelman et al. |
| 6,583,469 B1 | 6/2003 | Fried et al. |
| 6,642,114 B2 * | 11/2003 | Nakamura ................. 438/279 |
| 6,680,240 B1 | 1/2004 | Maszara |
| 6,689,650 B2 | 2/2004 | Gambino et al. |
| 6,696,345 B2 | 2/2004 | Chau et al. |
| 6,706,571 B1 | 3/2004 | Yu et al. |
| 6,713,396 B2 | 3/2004 | Anthony |
| 6,716,684 B1 | 4/2004 | Krivokapic et al. |
| 6,716,690 B1 | 4/2004 | Wang et al. |
| 6,800,885 B1 | 10/2004 | An et al. |
| 6,812,075 B2 | 11/2004 | Fried et al. |
| 6,852,559 B2 | 2/2005 | Kwak et al. |
| 6,858,478 B2 | 2/2005 | Chau et al. |
| 6,858,483 B2 | 2/2005 | Doczy et al. |
| 6,914,295 B2 | 7/2005 | Chau et al. |
| 7,005,366 B2 | 2/2006 | Chau et al. |
| 2001/0019886 A1* | 9/2001 | Bruce et al. ................. 438/666 |
| 2002/0011612 A1 | 1/2002 | Hieda |
| 2002/0081794 A1 | 6/2002 | Ito |
| 2003/0057486 A1 | 3/2003 | Gambino et al. |
| 2003/0129795 A1 | 7/2003 | Chau et al. |
| 2003/0143791 A1 | 7/2003 | Cheong et al. |
| 2004/0036126 A1 | 2/2004 | Chau et al. |
| 2004/0036127 A1 | 2/2004 | Chau et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0110097 A1 | 6/2004 | Ahmed et al. |
| 2004/0132236 A1 | 7/2004 | Doris |
| 2004/0155011 A1 | 8/2004 | Hareland et al. |
| 2004/0214385 A1 | 10/2004 | Doczy et al. |
| 2004/0241916 A1 | 12/2004 | Chau et al. |
| 2005/0040469 A1 | 2/2005 | Doczy et al. |
| 2005/0093075 A1 | 5/2005 | Bentum et al. |
| 2005/0104055 A1 | 5/2005 | Kwak et al. |
| 2005/0156171 A1 | 7/2005 | Brask et al. |
| 2005/0215022 A1* | 9/2005 | Adam et al. ................. 438/369 |
| 2006/0154478 A1* | 7/2006 | Hsu et al. ................... 438/637 |
| 2007/0108514 A1 | 5/2007 | Inoue et al. |

OTHER PUBLICATIONS

H. Koga, et al., "A 0.23μm$^2$ Double Self-Aligned Contact Cell for Gigabit DRAMs with a Ge-Added Vertical Epitaxial Si Pad," IEEE, pp. 22.1.1 to 22.1.4 (1996).

M. Stadele, et al., "A comprehensive study of corner effects in tri-gate transistors," XP010738402, Solid-State Device Research Conference 2004, pp. 165-168 (Sep. 21, 2004).

* cited by examiner

SELF-ALIGNED CONTACTS FOR TRANSISTORS

FIELD

Embodiments of the invention relate to semiconductor layout and fabrication. In particular, embodiments of the invention relate to self-aligned contacts for transistors and methods for fabricating the contacts.

BACKGROUND

Trigate transistors and nanowire devices (i.e., transistors having bodies made from nanowires) typically have small geometries. For trigate transistors, the diffusion regions and the gates are typically quite thin.

FIG. 1 illustrates a properly-aligned prior art trigate transistor structure 5 comprised of two trigate transistors having respective gates 7 and 8 and a common diffusion region 10. Spacers 1 and 2 are adjacent to gate 7. Spacers 3 and 4 are adjacent to gate 8. Metallic contacts 21, 22, and 23 provide electrical contacts to diffusion region 10.

One of the problems associated with certain prior art trigate transistors and nanowire devices is that external electrical resistance ("Rext") can sometimes be relatively high. High external electrical resistance can occur if metallic contacts are placed at some distance from the gate of a transistor with a thin diffusion body, such as a trigate transistor.

The placement of contacts 21, 22, and 23 shown in FIG. 1 is the goal in the prior art that is not always achieved, given the small geometries and lithography constraints. FIG. 2 shows trigate transistor structures 45 with a prior art contact misalignment problem. FIG. 3 shows transistor structure 45 in cross section. Contacts 31, 32, and 33 are misaligned with respect to respective gates 45 and 47 and respective spacers 52, 53, 54, and 55. A gap between a contact and a spacer (such as gap 42 between contact 32 and spacer 54) can result in higher Rext.

A device such as a static random-access memory ("SRAM") uses numerous trigate transistors. Misalignment problems with contacts can lead to variations in Rext for the various trigate transistors, however, leading to less predicatability with respect to the design and performance of the overall integrated circuit. This can result in transistor mismatches.

One approach in the prior art for dealing with the misalignment high Rext problem has been the epitaxial growth of silicon at the source and drain prior to silicide formation in order to help to reduce the external resistance. One problem with that prior art approach, however, is that it is difficult to make a large enough area for a contact using epitaxial growth on a small silicon area—i.e., there is not much silicon to work with.

Another approach in the prior art for dealing with the misalignment high Rext problem has been to create a silicon diffusion jog to serve as a landing pad, as illustrated in FIG. 4. Diffusion jog 60 is an extension of diffusion layer 62 of transistor 64, which includes gate 66 and spacers 67 and 68. Diffusion jog 60 serves as a landing pad for contact 70 and thus acts as a contact pad.

The prior art landing pad approach can be problematic, however. Due to lithography constraints, the prior art landing pads typically must lie relatively far from the gate of the transistor. The landing pad requires more layout space. The thin silicon body of the diffusion layer and diffusion jog between the contact and the gate typically results in high external electrical resistance. Moreover, the landing pads can create undersirable jogs, sometimes causing problems for optical lithography, especially for sub-100 nanometer ("nm") devices.

External electrical resistance problems can occur on devices beside trigate transistors. In principle, any transistor with a thin diffusion can have an Rext problem. The thin diffusion will result from lithography scaling, whether a trigate transistor is used or not. There can be Rext problems even on bulk devices on 65 nanometer nodes.

In the prior art, printing a rectangular contact in the diffusion direction sometimes can short the diffusion to the gate. Printing a rectangular contact in the direction perpendicular to the diffusion region can require more layout space.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Figure 1:
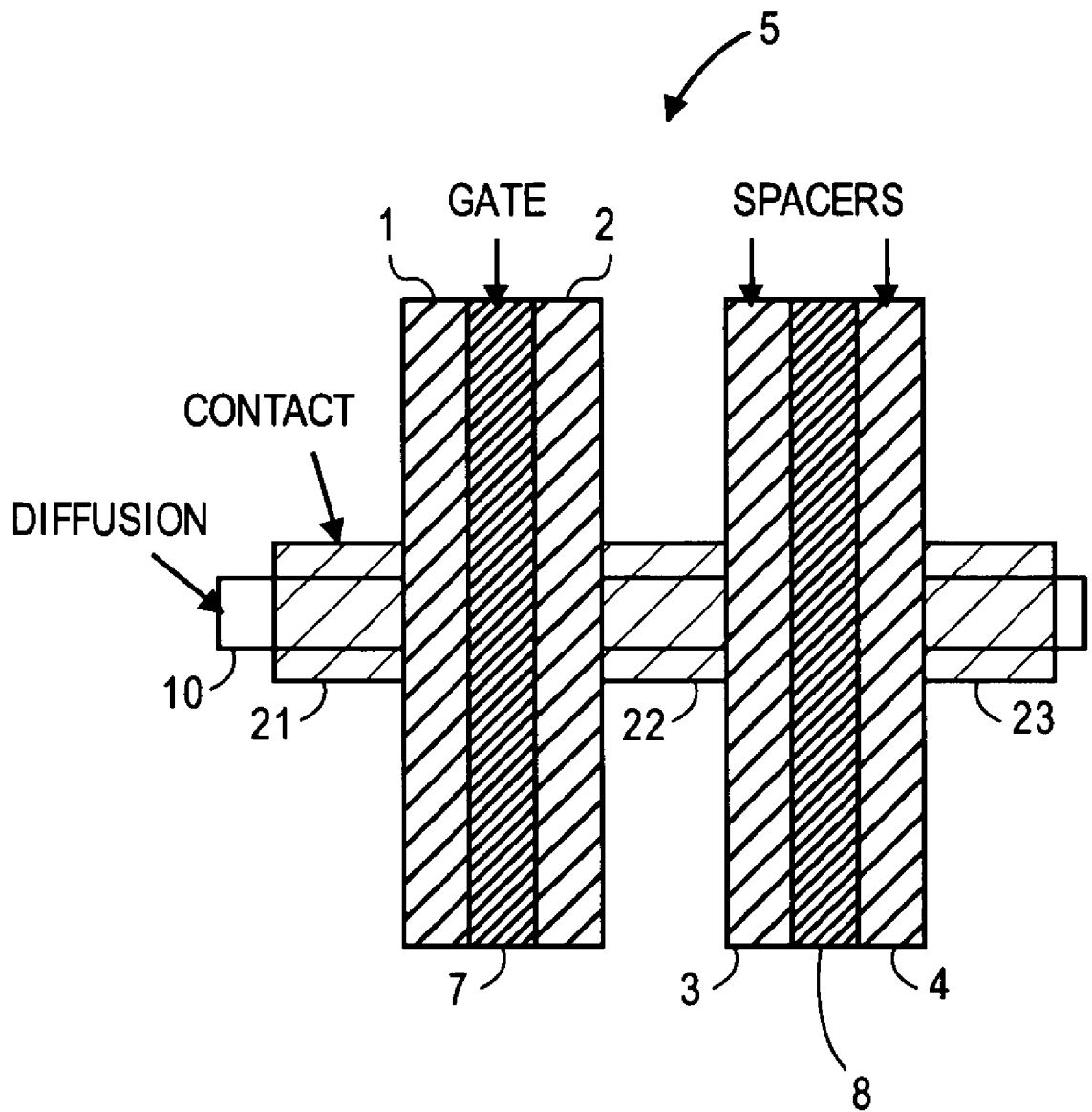
FIG. 1 shows a layout of a prior art trigate transistor structure with ideal contact placement.
Figure 2:
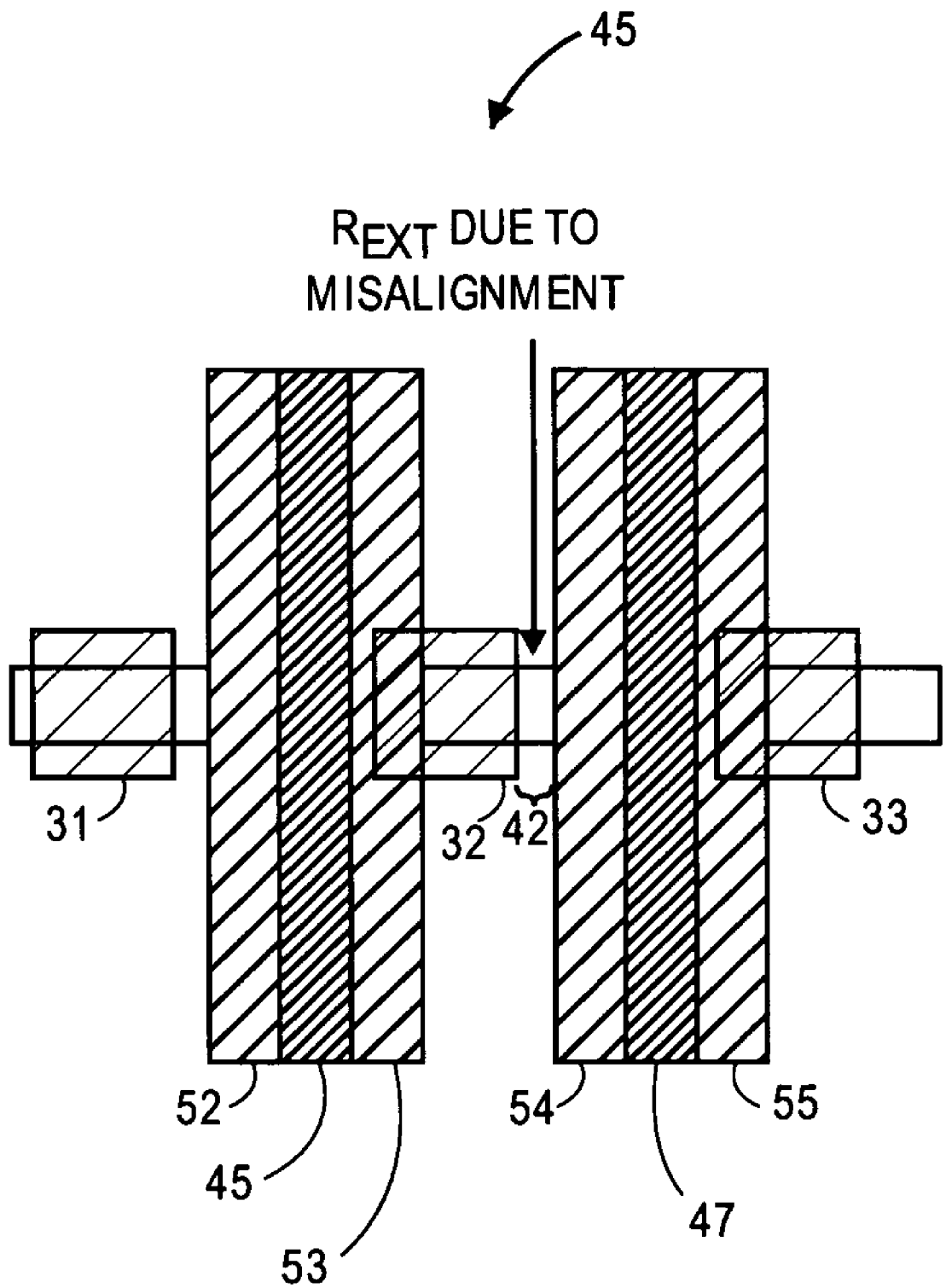
FIG. 2 shows a layout of a prior art trigate transistor structure with misaligned contacts.
Figure 3:
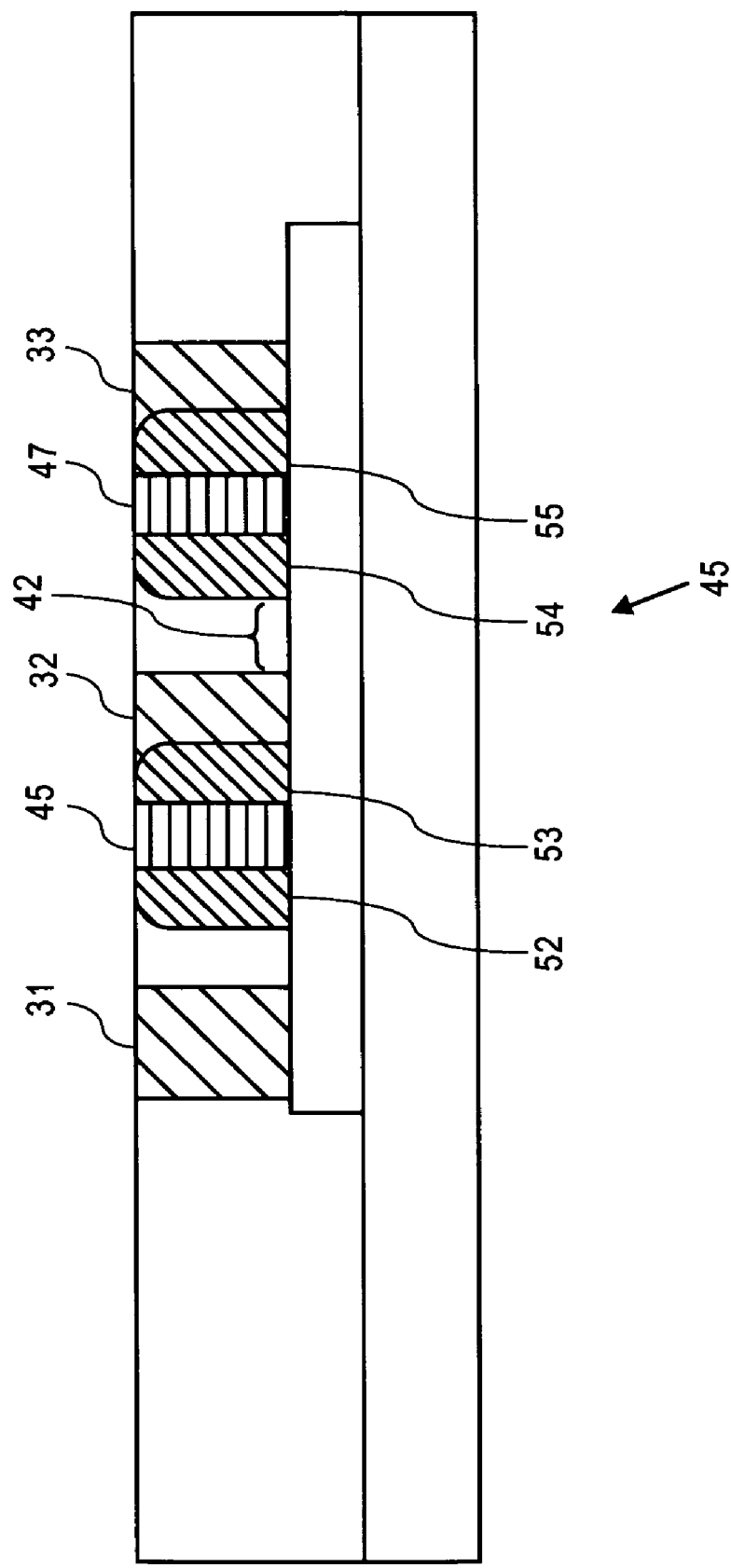
FIG. 3 is a cross section of a prior art trigate transistor structure with misaligned contacts.
Figure 4:
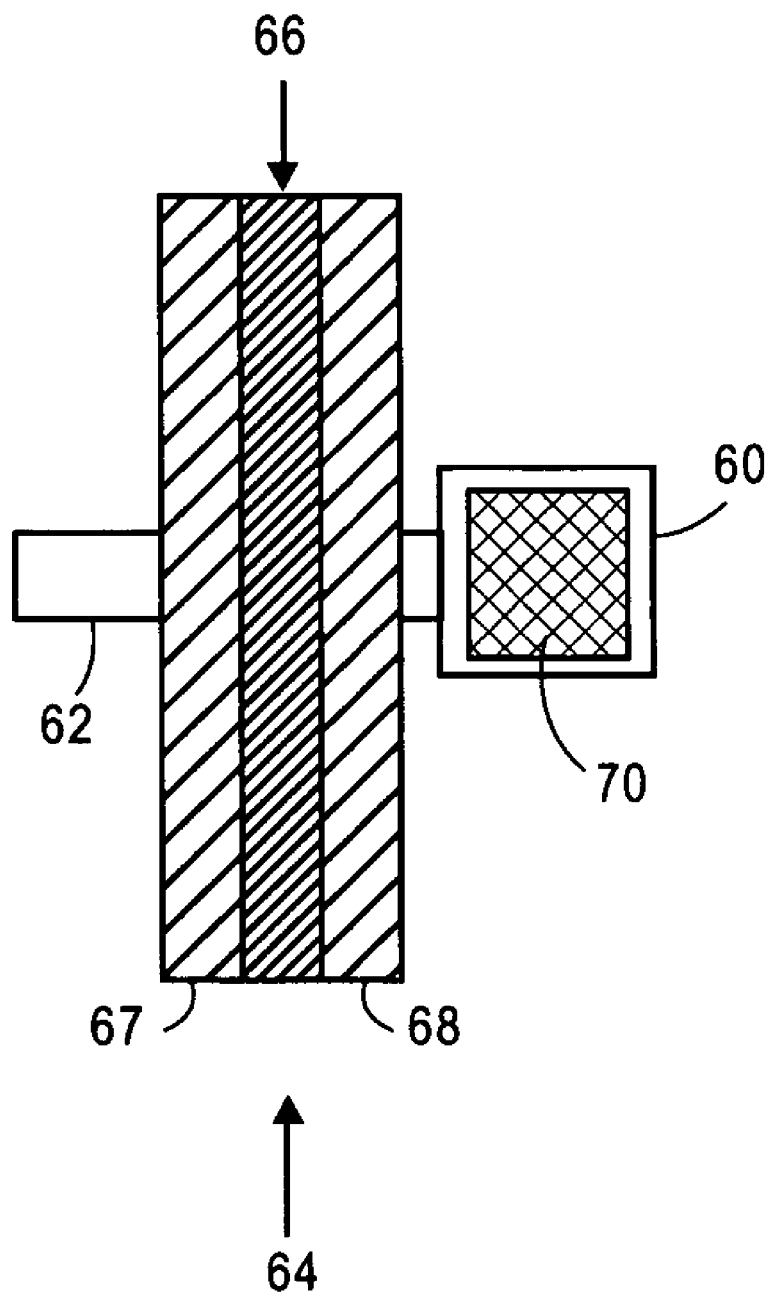
FIG. 4 shows a layout of a prior art transistor with a landing pad.

Embodiments of self-aligned contacts are described as well as methods for fabricating such contacts.

As described in more detail below, a self-aligned contact ("SAC") brings the contact physically all the way to a spacer associated with a gate of a transistor. This arrangement can help to minimize electrical external resistance ("Rext") associated with a thin and long diffusion body of the transistor. The minimization (or elimination) of Rext can also minimize (or eliminate) variations of Rext. Variations in Rext can cause transistor mismatches.

For one embodiment, superadjacent contacts reside in a layer above the self-aligned contacts and provide respective electrical connections to the self-aligned contacts. The self-aligned contacts have a relatively wide top surface layer and the superadjacent contacts have smaller horizontal cross sections than the respective self-aligned contacts. This means that the superadjacent contacts do not have to be precisely aligned with respect to the self-aligned contacts in order to provide proper electrical connections.

In order to form self-aligned contacts, a selective etch is performed. Photoresist is patterned to form an opening above an oxide layer containing one or more transistor gates. Each transistor gate has adjacent spacers. A selective etch is applied from the top of the wafer. The etch acts through the opening in the photoresist to etch the oxide adjacent to the spacers of the gates. The spacers and the gates are not etched by the selective etch. The etch exposes the source and drain regions of a lower diffusion layer. Contact material is deposited to form self-aligned contacts that reside immediately adjacent to the spacers. There are no alignment errors between the contacts and the transistor gate. That is why the self-aligned contacts are referred to as "self-aligned."

For one embodiment, superadjacent contacts are formed in a layer above the layer containing the self-aligned contacts. Even without being precisely aligned, the superadjacent contact provide electrical connections to the respective self-aligned contacts.

Instead of having to grow a large area for a landing pad, the self-aligned contact fabrication process can work with a small diffusion body itself or an epitaxial growth around the small diffusion body of the transistor Because it is difficult to enlarge a small diffusion body with epitaxial growth, a self-aligned contact can provide the benefit of reducing Rext by bringing the contacts to the respective source and drain for either case.

Moreover, the use of self-aligned contacts allows the printing of rectangular contacts, which may help to minimize a contact printing problem related to phase shift mask. Phase shift mask results in long lines printing better than small squares.

For one embodiment, a recess is formed at the top of each of the gates. Silicon nitride is deposited in the respective recesses in order to provide protection for the gates. Other embodiments do not employ the gate protection feature.

As described in more detail below, well-established silicon processes can be used as part of the self-aligned contact fabrication processes of embodiments of the invention.

FIGS. 5 through 10 illustrate process steps for forming self-aligned contacts for transistors. The process can be used for various types of transistors. The process is especially beneficial for transistors with an Rext problem. Such transistors can include transistors with a thin diffusion, such as trigate transistors, and even bulk devices on or beyond the 65 nanometer node.

Figure 5:
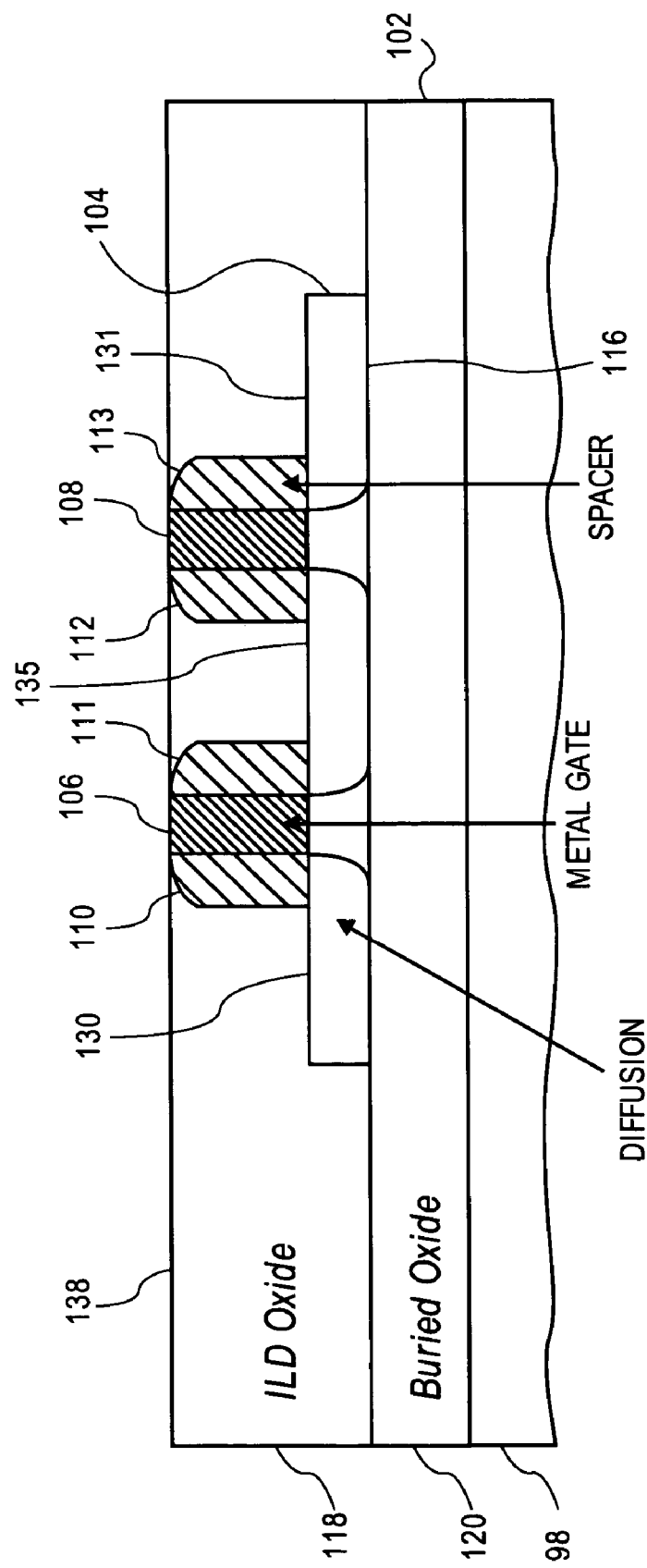
FIG. 5 is a cross section of a wafer with a transistor structure after metal polish.

FIG. 5 shows a cross section of a silicon wafer 102 that contains a transistor structure 116. Although a silicon-on-insulator ("SOI") substrate is illustrated, the process is applicable to transistors on bulk substrates. The transistor structure 116 is formed with a metal gate process. A replacement metal gate process includes patterning a gate with polysilicon and then etching out the polysilicon gate and replacing it with a metal gate. For a replacement metal gate process, the interlayer dielectric ("ILD") oxide layer 118 is planarized to the top of the metal gates 106 and 108. For a subtractive metal gate process, the planarization can stop above the metal gates 106 and 108. The self-aligned contact process is applicable to either the replacement metal gate process or the subtractive metal gate process. For FIGS. 5 and 6, the ILD layer 118 is shown as planarized to the top of the metal gates 106 and 108.

Although the self-aligned contact process described is applicable to transistors with metal gates, the self-aligned contact process is not restricted to a particular way the metal gates are formed.

The transistor structure 116 includes diffusion layer 104 (also called diffusion body 104 or fin 104); gates 106 and 108; and spacers 110, 111, 112, and 113. The diffusion layer 104 includes drain region 135 and source regions 130 and 131.

For one embodiment, diffusion layer 104 is formed as an SOI structure. Buried oxide layer 120 is the insulator residing beneath the silicon diffusion layer 104. A silicon substrate 98 resides beneath buried oxide layer 120. Gates 106 and 108 are each metal gates. For a replacement metal gate process, metal gates 106 and 108 are formed after planarization of ILD layer 118. For a subtractive metal gate process, planarization of ILD layer 118 is done after formation of gates 106 and 108. Spacers 110 through 113 can be made of silicon nitride ("SiN").

After the formation of transistor structure 116 and the planarization of ILD layer 118, one of two different processing options is used to form self-aligned contacts.

One option is referred to as the no gate-protect option, which is described below in reference to FIGS. 6 through 16. For the no gate-protect option, there is no additional protection layer formed on gates 106 and 108. For the no gate-protect option, the self-aligned contact simply provides a landing pad for an additional contact layer. After the contact layer is patterned, then an additional metal one layer for the metal lines is patterned, as described in more detail below.

The second option is the gate-protection option, which is described with respect to FIGS. 17-27. For the gate-protection option, a recess is formed with respect to each of the gates 106 and 108. Each gate recess is filled with silicon nitride in order to protect the gate. A self-aligned contact is formed. A metal one layer is then deposited directly above the layer containing the self-aligned contact. Having protection on the gates results in a greater tolerance with respect to alignment errors with respect to the metal one layer. Having protection on the gates also allows smaller spacing between gates, resulting in a more efficient layout.

Figure 6:
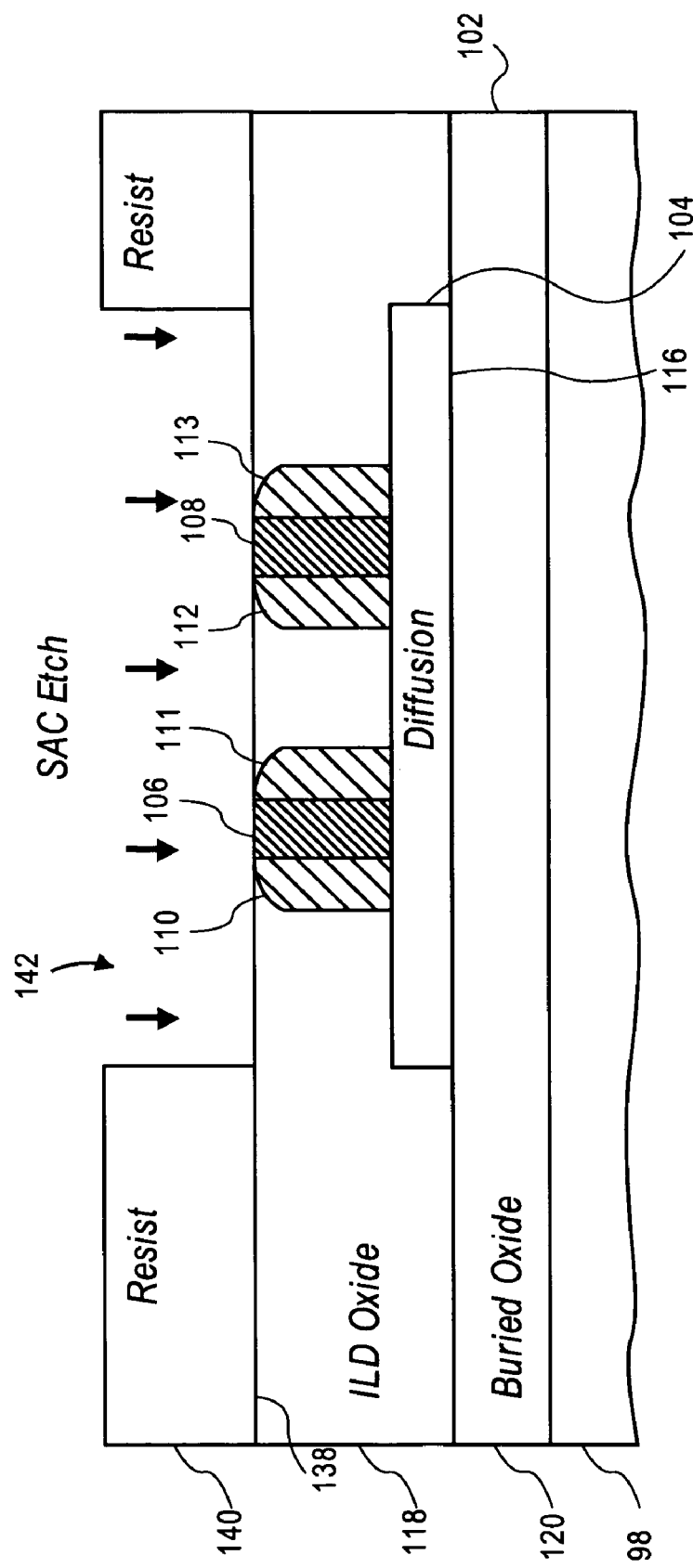
FIG. 6 is a cross section of the wafer with a photoresist pattern done in preparation for an etch.

FIGS. 6 through 16 illustrate the no gate-protection option. As shown in FIG. 6, photoresist 140 is spun onto top layer 138 of wafer 102 and ILD oxide layer 118. Photoresist layer 140 is then patterned. The pattern of photoresist layer 140 includes an opening 142. A selective dry etch of oxide against nitride is applied from the top of wafer 102 to produce a selective etch that removes the ILD oxide material beneath area 142. The etch is selective because spacers 110 through 113 are comprised of silicon nitride which is not etched by the dry etch. Such a selective dry etch has been widely used by the semiconductor industry in sub half-micron technologies. Gates 106 and 108 are metal gates that are also not etched by the selective etch. An aluminum gate, for example, cannot be etched by a fluorine or oxygen based dry etch for silicon oxide.

For one embodiment, opening 142 is rectangular and symmetrical with respect to gates 106 and 108. For other embodiments, opening 142 can have other shapes and need not be symmetrical with respect to gates 106 and 108. For example, opening 142 can be circular, square, etc. For example, opening 142 can be shifted left or right.

For one alternative embodiment, a single gate with spacers can reside under opening 142. For alternative embodiments, multiple openings are used for multiple gates with spacers. For other alternative embodiments, three or more gates with spacers can reside under a single opening 142.

The etch is completed after diffusion layer 116 is exposed for contact. For one embodiment, the etch removes part of the top of the exposed diffusion layer 116 in order to maximize the contact area. The photoresist layer 140 is then removed using known techniques.

Figure 7:
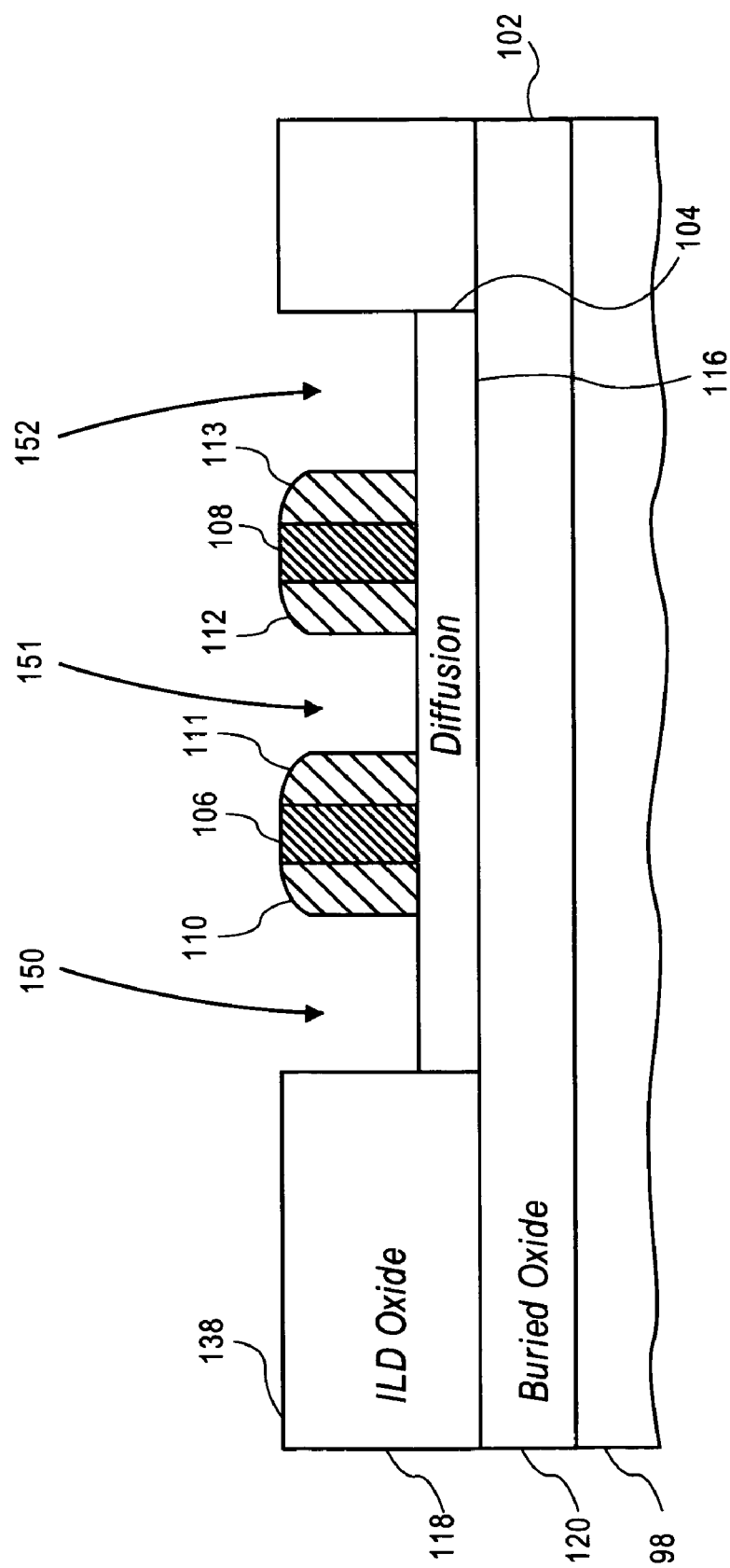
FIG. 7 is a cross section of the wafer after an etch and after removal of the photoresist.

The result is shown in FIG. 7. The selective etch results in openings 150, 151, and 152 down to the diffusion layer 104. Spacers 110 through 113 and gates 108 and 106 remain standing, with limited removal of those structures. The portions of the ILD oxide layer 118 that resided beneath the photoresist layer 140 remain intact.

For alternative embodiments, openings 150, 151, and 152 can have various sizes.

Figure 8:
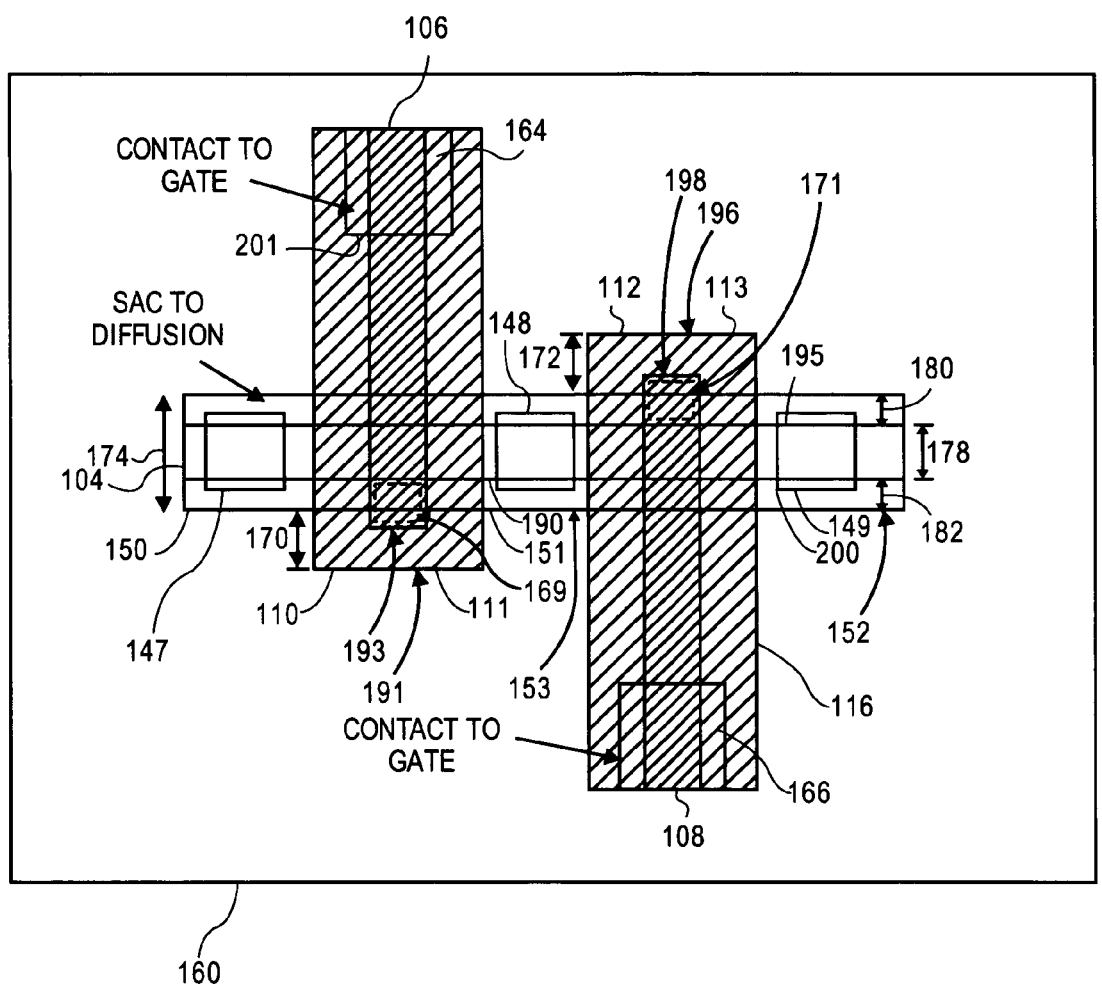
FIG. 8 is a top view of the wafer after the etch, showing the transistor structure.

FIG. 8 is a top view showing section 160 of wafer 102 and the self-aligned contact etch having openings 150, 151, and 152. FIG. 8 also shows a top view of transistor structure 116 having diffusion layer 104, spacers 110 through 113, and gates 106 and 108.

The transistor structure 116 includes polysilicon end caps 169 and 171. Polysilicon end cap 169 extends from edge 190 of diffusion layer 104 to point 193. The spacer around polysilicon end cap 169 extends to point 191. Polysilicon end cap 171 extends from edge 195 of diffusion layer 104 to point 198. The spacer around polysilicon end cap 171 extends to point 196.

Each of the polysilicon end caps 169 and 171 needs to be long enough in order to avoid shorts around the respective gates 106 and 108. Thus, the self-aligned contact etch cannot be too wide. If the self-aligned contact selective etch is too wide, then the subsequent step of depositing contact metal will result in the contact metal shorting between regions 150, 151, and 152, thereby resulting in improper operation or non-operation of the transistor structure 116.

For one embodiment, a design rule is in place for the end caps 169 and 171 such that the end caps 169 and 171 are large enough to accommodate any alignment errors with respect to the self-aligned contact etch. The alignment tolerance and spacer thickness associated with a particular technology can be used in calculating self-aligned contact widths that will not result in shorts. One example of a design rule calculation for a 90 nanometer node is as follows. The alignment tolerance between the self-aligned contact and poly is 60 nanometers. The alignment tolerance between poly and diffusion is 60 nanometers. The width 178 of the diffusion layer 104 is 100 nanometers. The 100 nm diffusion is smaller than a typical 90 nm design rule at 140 nm, but is chosen here to illustrate the advantages of self-aligned contacts. Because poly is aligned to diffusion, the alignment between a self-aligned contact and the diffusion is equal to the square root of the sum $60^2 + 60^2$, or 85 nm. To ensure a minimum of 40 nanometer coverage on a 100 nanometer wide diffusion, such as diffusion layer 104, the self-aligned contact opening needs to extend beyond each diffusion edge 190 and 195 by 25 nanometers (i.e., 85 nm−(100−40)=25 nm). Thus, each of the distances 180 and 182 is 25 nanometers. The width 174 of the self-aligned contact 150 is 150 nm (i.e., 25 nm+100 nm+25 nm=150 nm), which is readily patterned in a 90 nm mode. If the difference is wider than 100 nm, the overlap will be larger.

The misalignment of a self-aligned contact can result in a worst case wherein an edge of self-aligned contact 151 is located relative to edge 191 of the spacer at a distance $X = (25 + 60 - p - 50)$ nm, wherein 25 nm is the distance from an edge 153 of self-aligned contact 151 to diffusion edge 190, 60 nm is the alignment tolerance between a self-aligned contact and poly, "p" is the length of the poly end cap 169 from 190 to 193, and 50 nm is assumed to be the spacer thickness from 193 to 191. If "X" is greater than zero, then the edge 153 of self-aligned contact 151 would be located beyond the spacer edge 191 and the contacts 150 and 151 to the respective drain and source would short to each other around the gate 106.

To ensure proper isolation, assuming a margin of 40 nm, the poly end cap length "p" must be greater than 75 nm (i.e., p>40 nm+35 nm). The poly end cap for 90 nm is set at 100 nm to allow a 40 nm margin on top of the alignment tolerance (i.e., 100 nm=60 nm+40 nm). Therefore, the typical design rule for the poly end cap, such as poly end cap 169, is sufficient to ensure that the self-aligned contacts (such as contacts 150 and 151) do not short around the gate, such as gate 106 (i.e., 100 nm>75 nm).

For sub-100 nm lithography, the design rules typically follow a 0.7× scaling ruler per generation. When techniques such as optical proximity correction ("OPC") are employed, the precise design rules need to be computed with considerations of the critical dimension ("CD") print bias and the OPC methods. Nevertheless, the method of computation is similar to the one illustrated above.

There is no impact on the layout area as a result of the self-aligned contact etch with the no gate-protect option. A self-aligned contact etch using the gate-protect option allows a smaller layout area.

FIG. 8 also shows (1) contact 164 made to reach gate 106, (2) contact 166 made to reach gate 108, and (3) contacts 147, 148, and 149 made to reach diffusion layer 104. The metal one layer above transistor structure 116 contains metal lines (not shown) above respective contacts 164, 166, 147, 148, and 149.

Figure 9:
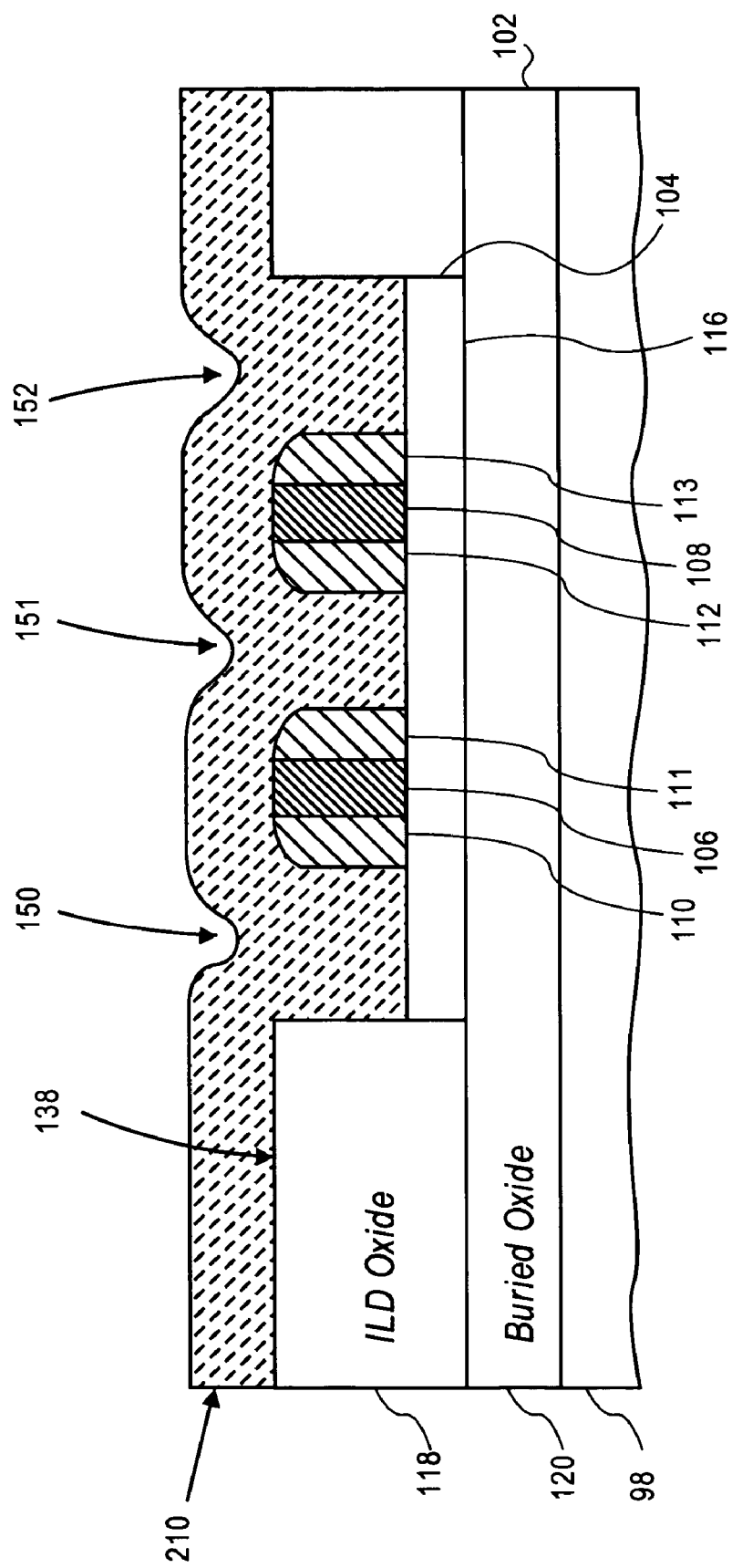
FIG. 9 is a cross section of the wafer after contact metal deposition.

FIG. 9 shows a cross section of wafer 102 with respect to the next operation for the no gate-protect option process. A layer 210 of contact metal is deposited on top 138 of ILD oxide layer 118 and fills openings 150, 151, and 152.

For certain embodiments, chemical vapor deposition ("CVD") or atomic layer deposition ("ALD") can be used to form layer 210. Alternatively, other techniques, such as electroplating or electroless plating, can be used.

Figure 10:
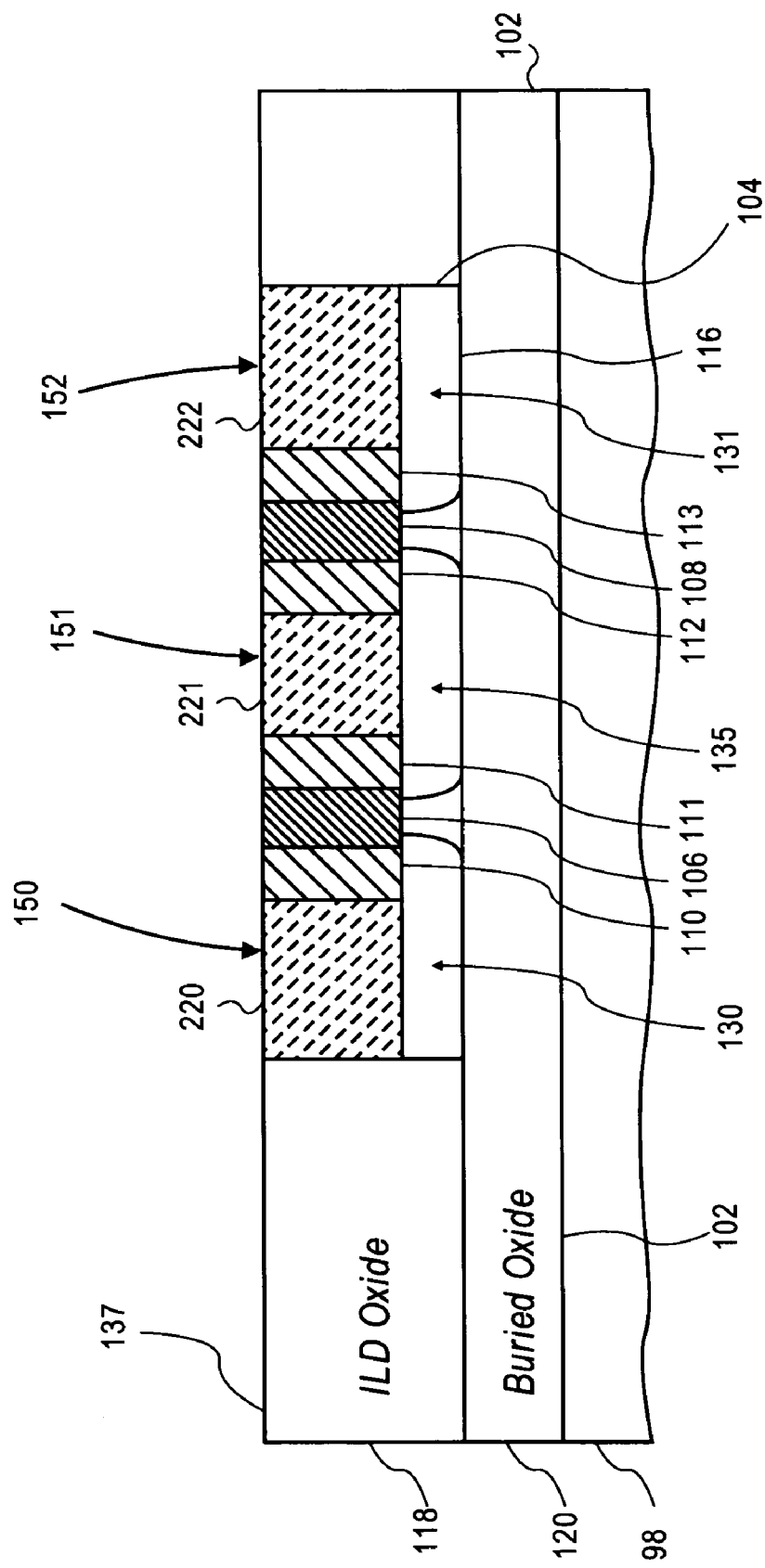
FIG. 10 is a cross section of the wafer after planarization.

As shown in FIG. 10, the contact metal layer 210 of FIG. 9 has been polished and planarized to level 137, which is a level slightly below the original top level 138 of ILD oxide layer 118 and slightly below the original tops of gates 106 and 108 and spacers 110-113. For one embodiment, level 137 need not be perfectly flat and the ILD oxide need not be completely flush with respect to contacts 220-222. The result of the planarization is that contact metal 220 resides in opening 150, contact metal 221 resides in opening 151, and contact metal 222 resides in opening 152. When polished to the targeted level, contact metals 220 to 222 will be isolated from each other by the spacers and gates between the contact metals 220, 221, and 222. For example, contact metal 220 is isolated from contact metal 221 by gate 106 and spacers 110 and 111.

Contact metal 220 contacts drain region 130 of diffusion layer 104. Contact metal 222 contacts the drain region 131 of diffusion layer 104. Contact metal 221 contacts the source region 135 of diffusion layer 104. Contact metal 220 reaches the edge of spacer 110. Contact metal 221 reaches the respective edges of spacers 111 and 112. Contact metal 222 reaches the edge of spacer 113.

The contact metal regions 220, 221, and 222 comprise self-aligned contacts. The self-aligned contacts 220, 221, and 222 provide respective landing pads for a superadjacent contact layer (i.e., a contact layer residing above the self-aligned contacts 220, 221, and 222), described below. The contact metal regions 220, 221, and 222 provide contact material above the diffusion layer 104 up to the tops of the respective spacers 110-113.

The superadjacent contacts with respect to the contact metal regions 220, 221, and 222 do not have to be precisely aligned in order to provide electrical contact. The relatively wide top surface areas of self-aligned contacts 220, 221, and 222 provide sufficient regions for electrical contact to the superadjacent contact layer described below.

Figure 11:
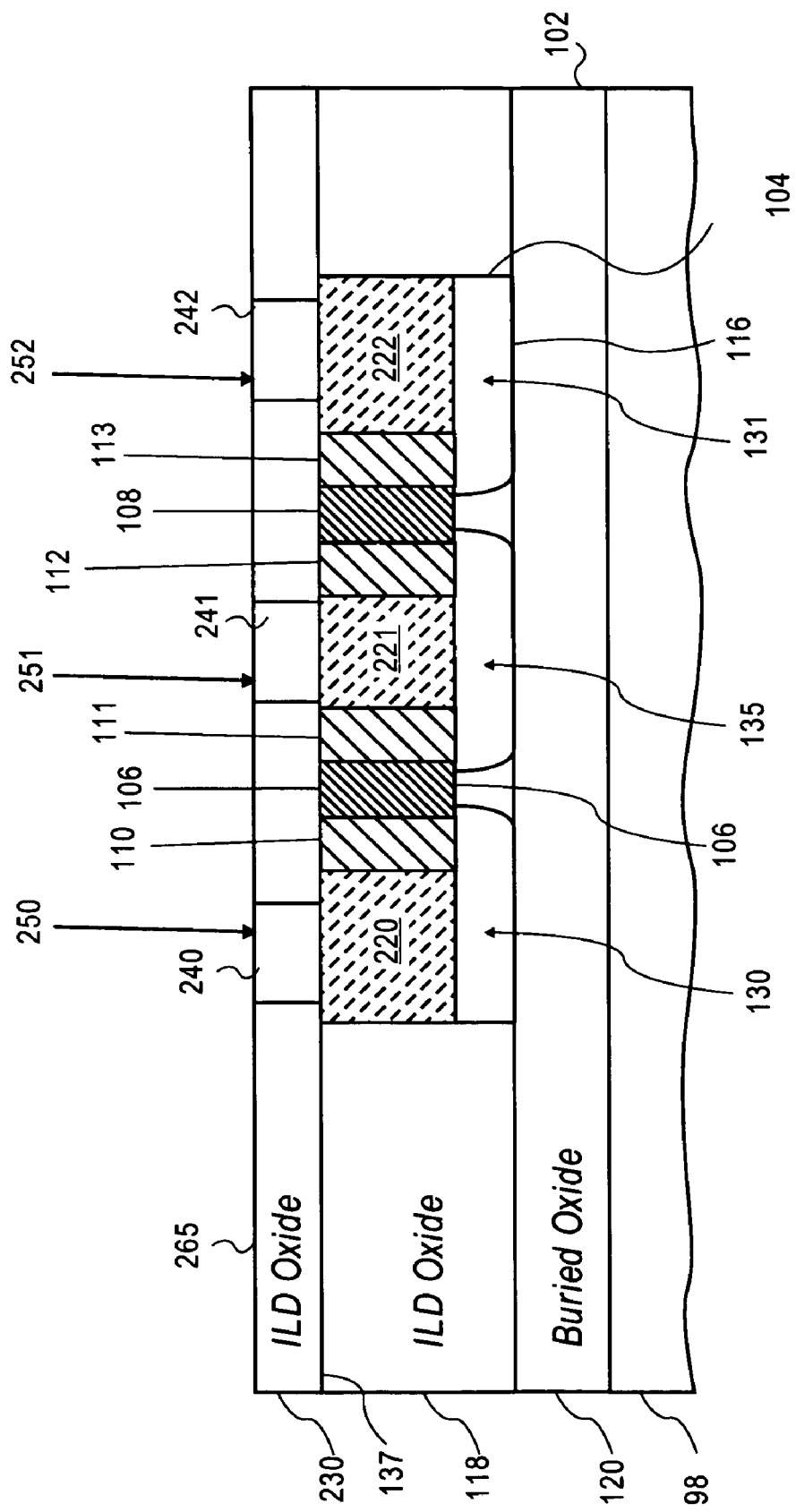
FIG. 11 is a cross section of the wafer after the deposition of an interlayer dielectric and the patterning of contacts.

As shown in FIG. 11, an ILD oxide layer 230 is deposited on the top 137 of wafer 102. Photoresist is deposited on the top 265 of the ILD oxide layer 230. The photoresist layer is then patterned to provide openings. Vias 240, 241, and 242 are then etched into the ILD oxide layer 230. The photoresist is removed. A metal layer is then deposited on the top 265 of wafer 102, and the metal fills vias 240, 241 and 242. The metal layer on top of wafer 102 is then polished and planarized back to top 265 of wafer 102. The result is that metal 250, 251, and 252 resides in respective vias 240, 241, and 242. Thus, metal contacts 250, 251, and 252 are formed. Metal contacts 250, 251, and 252 provide electrical contact to respective self-aligned metallic contacts 220, 221, and 222. The self-aligned contacts 220, 221, and 222 thus provide landing pads for respective contacts 250, 251, and 252. For one embodiment, contacts 250, 251, and 252 each have a smaller horizontal surface area than respective self-aligned contacts 220, 221, and 222. In other words, contacts 250, 251, and 252 use only a portion of the respective landing pads of self-aligned contacts 220, 221, and 222. For one embodiment of the invention, contacts 250, 251, and 252 may be rectangular contacts.

The precise location of contacts 250, 251, and 252 is not required as long as contacts 250, 251, and 252 contact self-aligned contact landing pads 220, 221, and 222. Thus, an advantage of this scheme is that self-aligned contacts 220, 221, and 222 provide contact to the diffusion layer 104 right up to the edges of respective spacers 110, 111, 112, and 113. Contacts 250, 251, and 252, on the other hand, merely need to contact respective contacts 220, 221, and 222 in order to provide electrical contact right up against respective spacers 110, 111, 112, and 113.

Although FIG. 11 shows superadjacent contacts 240, 241, and 242 in relatively good alignment with respect to the larger self-aligned contacts 220, 221, and 222, for other embodiments contacts 240, 241, and 242 can be misaligned with respect to self-aligned contacts 220, 221, and 222 as long as there is some metal-to-metal contact that provides an adequate electrical connection between superadjacent contacts 240, 241, and 242 and respective self-aligned contacts 220, 221, and 222.

Figure 12:
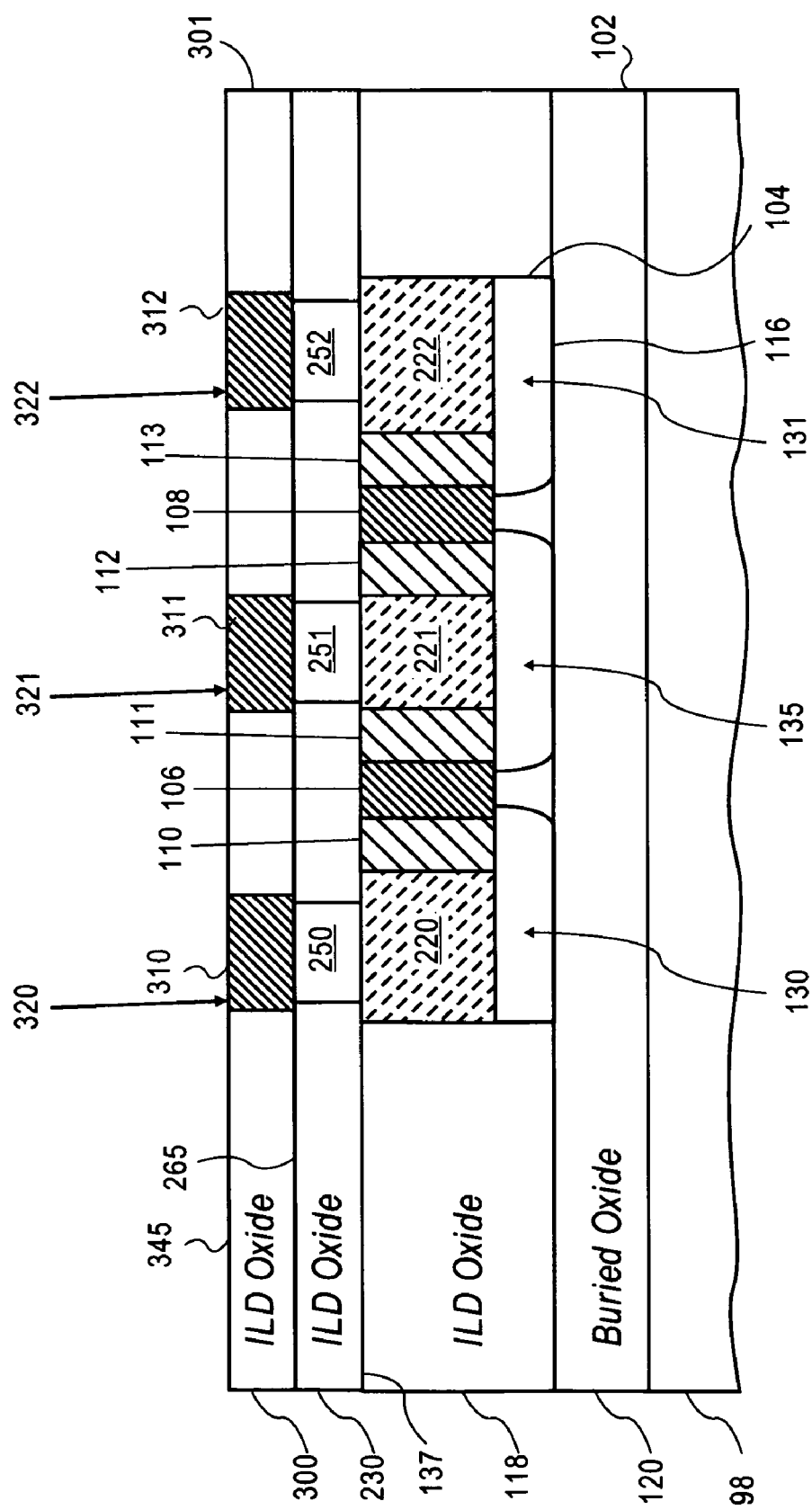
FIG. 12 is a cross-section of the wafer after the deposition of a first metal layer.

FIG. 12 shows a cross section of wafer 102 after the metal lines 320, 321, and 322 are patterned as part of metal one layer 301 using a standard back end process.

The back end process includes deposition of ILD oxide layer 300; photoresist deposition end patterning; selective etching to form vias 310, 311, and 312; metal deposition to fill vias 310, 311, and 312; and planarization. Metal lines 320, 321, and 322 in respective vias 310, 311, and 312 provide electrical contact down to diffusion layer 104 via respective contacts 250, 251, and 252 and respective self-aligned contacts 220, 221, and 222. Thus, metal lines 320 and 322 provide electrical contact to respective drain regions 130 and 131.

Metal line 321 provides electrical contact to source region 135. Metal lines 320, 321, and 322 run to various other transistor structures on wafer 102.

Figure 13:
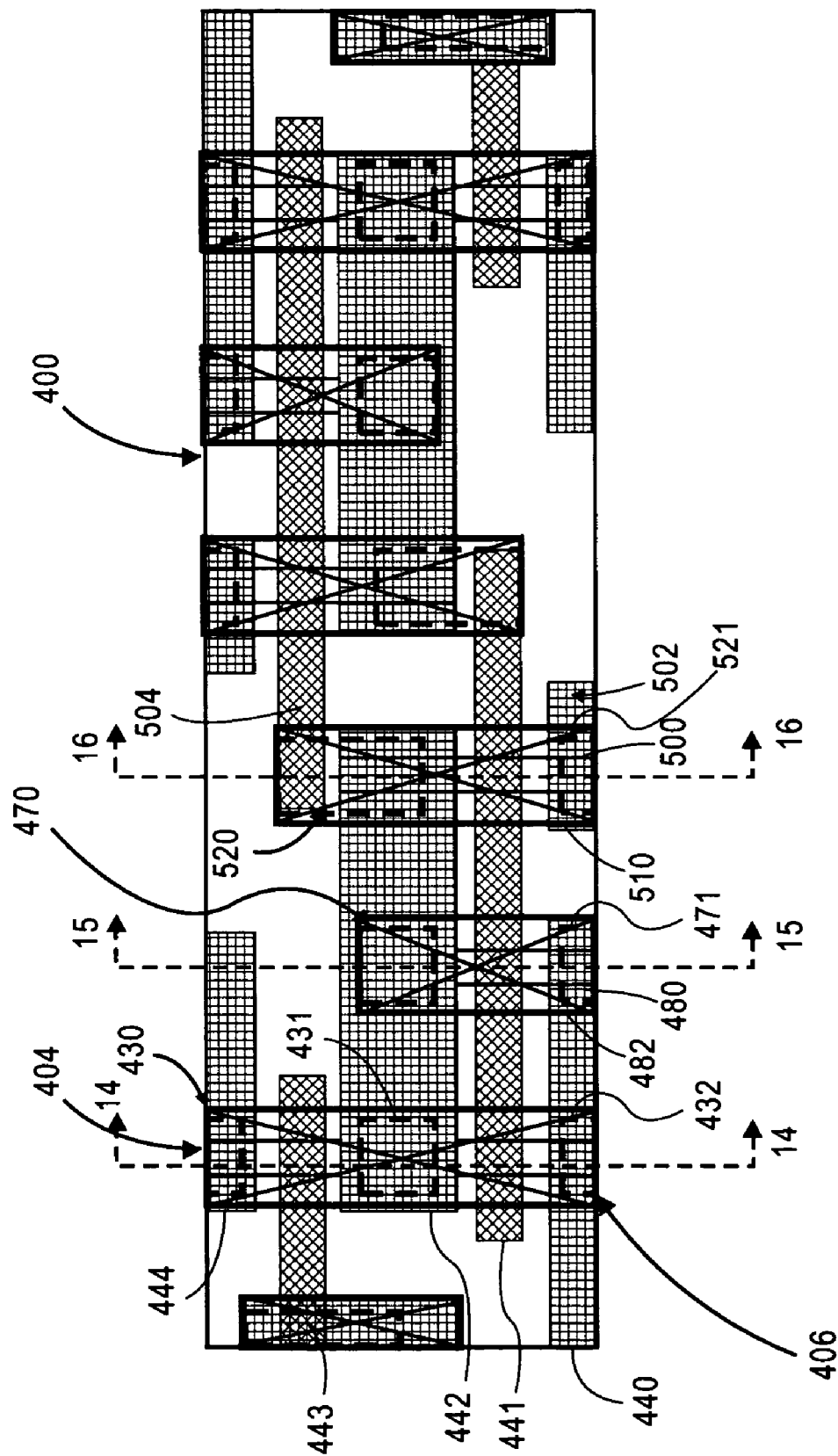
FIG. 13 is a layout up to the first metal layer of an SRAM with transistors having self-aligned contacts.

FIG. 13 is a top view of a layout 400 of a static random access memory ("SRAM") containing transistor structures. Layout 400 in FIG. 13 shows only one cell. The actual cell array for the SRAM has more cells. The SRAM includes self-aligned contacts with the no gate-protection option. The SRAM layout 400 is illustrated up through the metal one layer.

The self-aligned contact openings 406, 482, and 510 shown in FIG. 13 include the self-aligned contacts. Metal one line 440 is coupled to Vss. Metal one line 442 is a node connection. Metal one line 502 is coupled to a bit line. Metal one line 502 is coupled to Vcc. Gates 441, 443, and 504 are shown in FIG. 13. FIG. 13 also shows contacts 430, 431, 432, 470, 471, 520, and 521 that reside in a layer that lies beneath the metal one layer. An N-type metal oxide semiconductor ("NMOS") diffusion layer 404 resides under the self-aligned contact opening 406. An NMOS diffusion layer 480 resides under self-aligned contact opening 482. A P-type metal oxide semiconductor ("PMOS") diffusion layer 500 resides under self-aligned contact opening 510.

Figure 14:
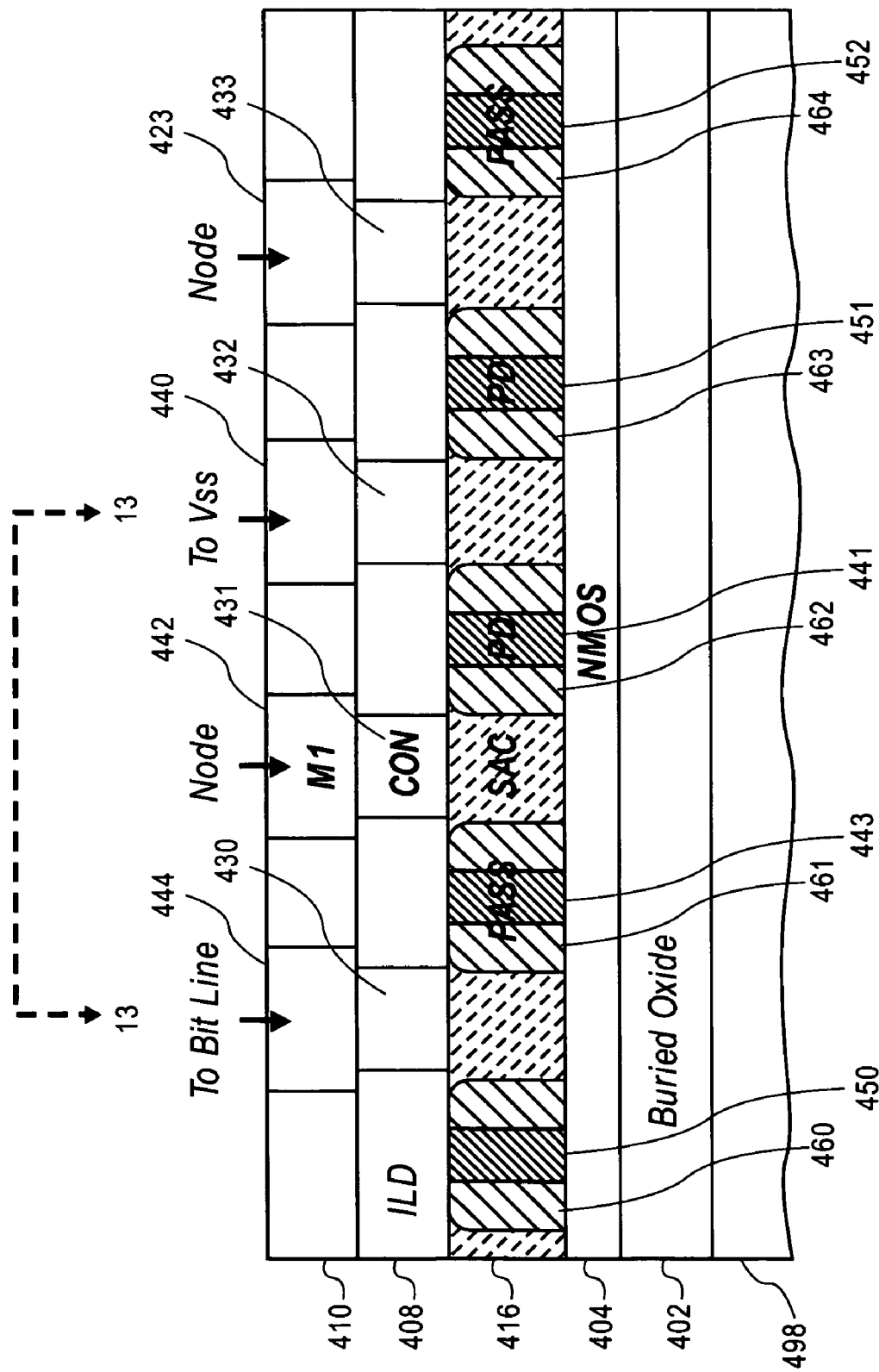
FIGS. 14-16 are cross sections of the SRAM of FIG. 13.
Figure 15:
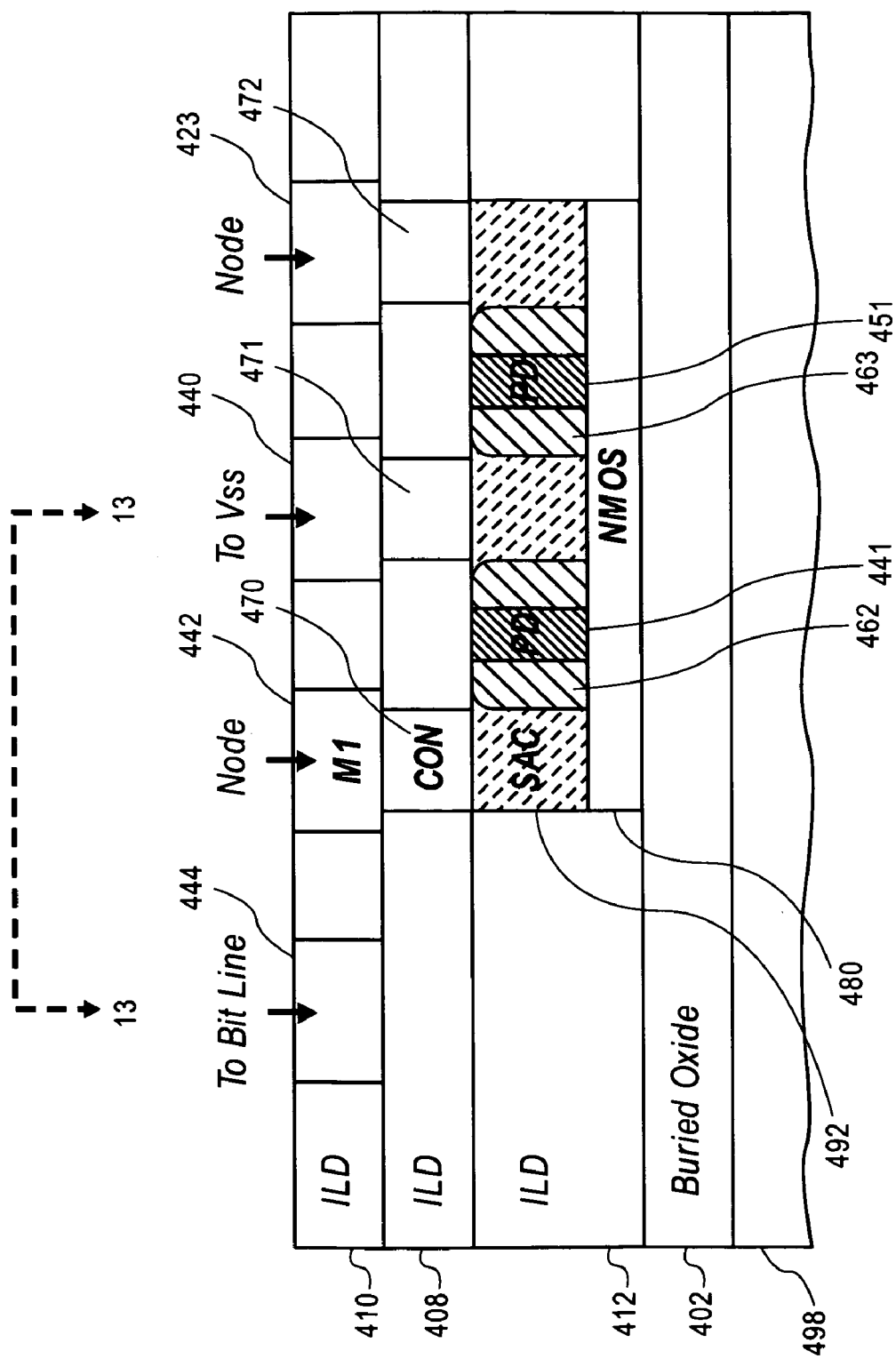
Figure 16:
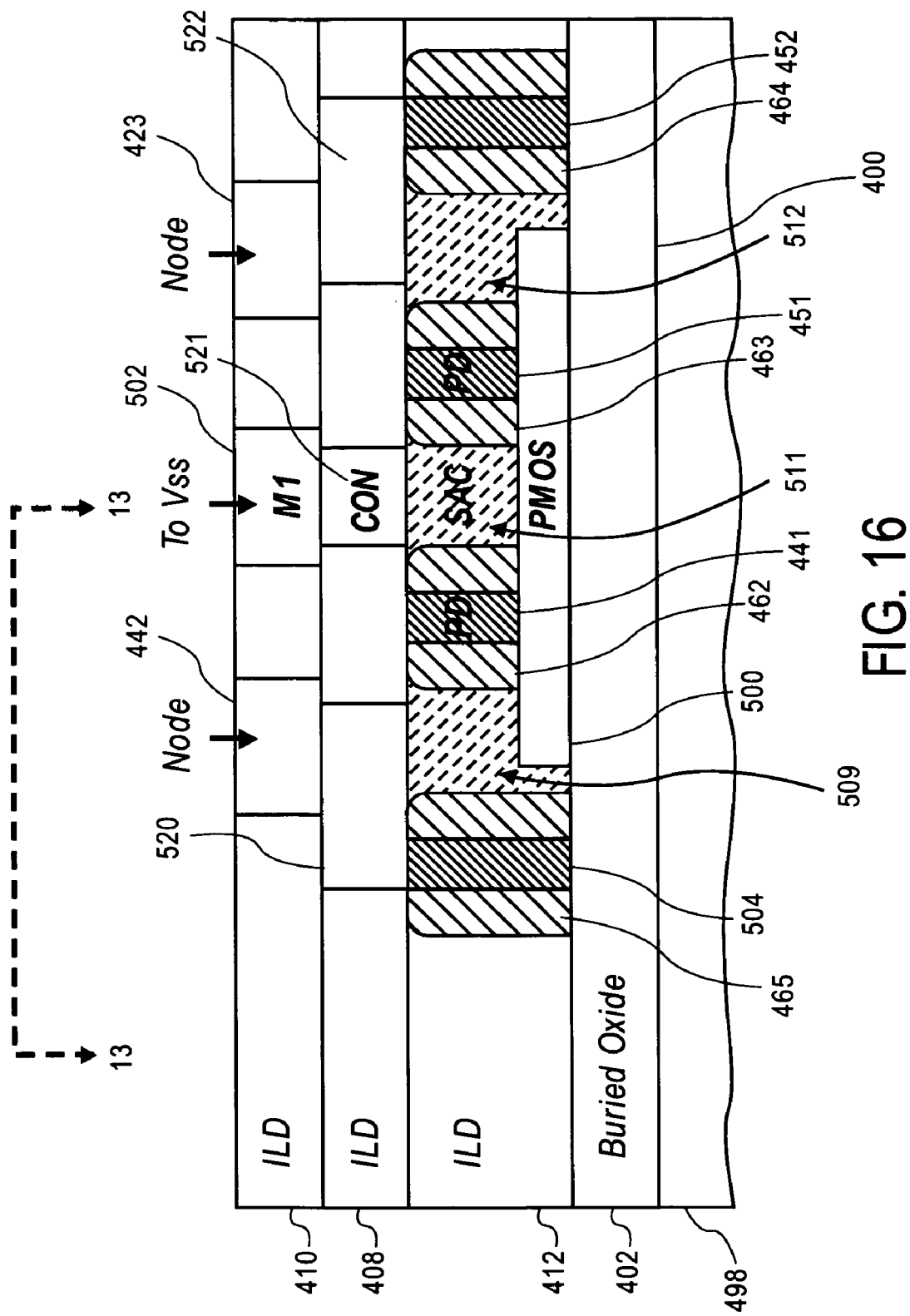

Cross sections of the SRAM layout 400 are shown in FIGS. 14, 15, and 16. Each of the cross sections shown in FIGS. 14-16 is for multiple cells. Thus, each of the cross sections of FIGS. 14-16 extends beyond the one-cell layout 400 shown in FIG. 13.

As shown in FIG. 14, contacts 430, 431, 432, and 433 reside within interlayer dielectric oxide layer 408 that is above the self-aligned contacts 416. Metal lines 444, 442, 440, and 423 reside in interlayer dielectric oxide layer 410, which is the metal one layer above layer 408. Bit line 444 is superadjacent to and contacts the contact 430. The metal line 442 (coupled to a node) resides above and contacts the contact 431. The metal line 440 connected to Vss resides above and contacts the contact 432. The metal line 423 acts as a node and resides above and contacts the contact 433.

A buried oxide layer 402 resides underneath the diffusion layer 404. Silicon substrate 498 resides beneath buried oxide layer 402. Gate structures 461 and 464 (with respective gates 443 and 452) are part of NMOS passivation transistors. Gate structures 462 and 463 (with respective gates 441 and 451) are part of NMOS pull-down transistors. Gate structure 460 includes gate 450.

As shown in FIG. 15, contacts 470, 471, and 472 reside above the respective self-aligned contacts 492. The contacts 470, 471, and 472 reside within vias in interlayer dielectric oxide layer 408. The metal one layer 410 comprises metal lines 444, 442, 440, and 423 that reside within the interlayer dielectric oxide layer 410. Metal line 444 is coupled to a bit line. Metal line 442 is a node that resides above and contacts the contact 470. Metal line 440 is connected to Vss and resides above and contacts the contact 471. Metal line 423 acts as a node and resides above and contacts the contact 472.

The buried oxide layer 402 resides underneath the NMOS diffusion layer 480. The interlayer dielectric oxide layer 412 resides above the buried oxide layer 402. Gate structures 462 and 463 (with respective gates 441 and 451) are part of NMOS pull-down transistors.

As shown in FIG. 16, contacts 520, 521, and 522 reside above the respective self-aligned contacts 509, 511, and 512. Contact 520 connects gate 504 (of gate structure 465) with self-aligned contact 509. Contact 522 connects gate 452 (of gate structure 464) with self-aligned contact 512. Contact 521 contacts self-aligned contact 511. Gate structures 462 and 463 (with respective gates 441 and 451) are part of NMOS pull-down transistors. The contacts 520, 521, and 522 reside within the interlayer dielectric oxide layer 408.

The metal one layer comprises the interlayer dielectric layer 410, which includes metal lines 442, 502, and 423. The metal line 442 acts as a node that resides above and contacts the contact 520. The metal line 502 connects with Vss and resides above and contacts the contact 521. The metal line 423 acts as a node residing above contact 522.

The cell size shown in FIGS. 13 though 16 does not assume a spacer process for patterning the diffusion layers. Lithography requires a minimum space between two self-aligned contacts to be resolved. If the space becomes too small, as feasible with a spacer process, lithography cannot resolve the two self-aligned contact lines. If a spacer process is used to reduce diffusion-to-diffusion space, the self-aligned contact between the two legs of a pull-down device will have to merge. As long as the extension of a self-aligned contact is properly designed, however, as shown by self-aligned contacts 492 of FIG. 15, there will be no problem with shorting around the gates. In other words, the self-aligned contact should not be too big, but the self-aligned contact should be big enough to tolerate the alignment error and to satisfy the minimum contact area required.

Figure 17:
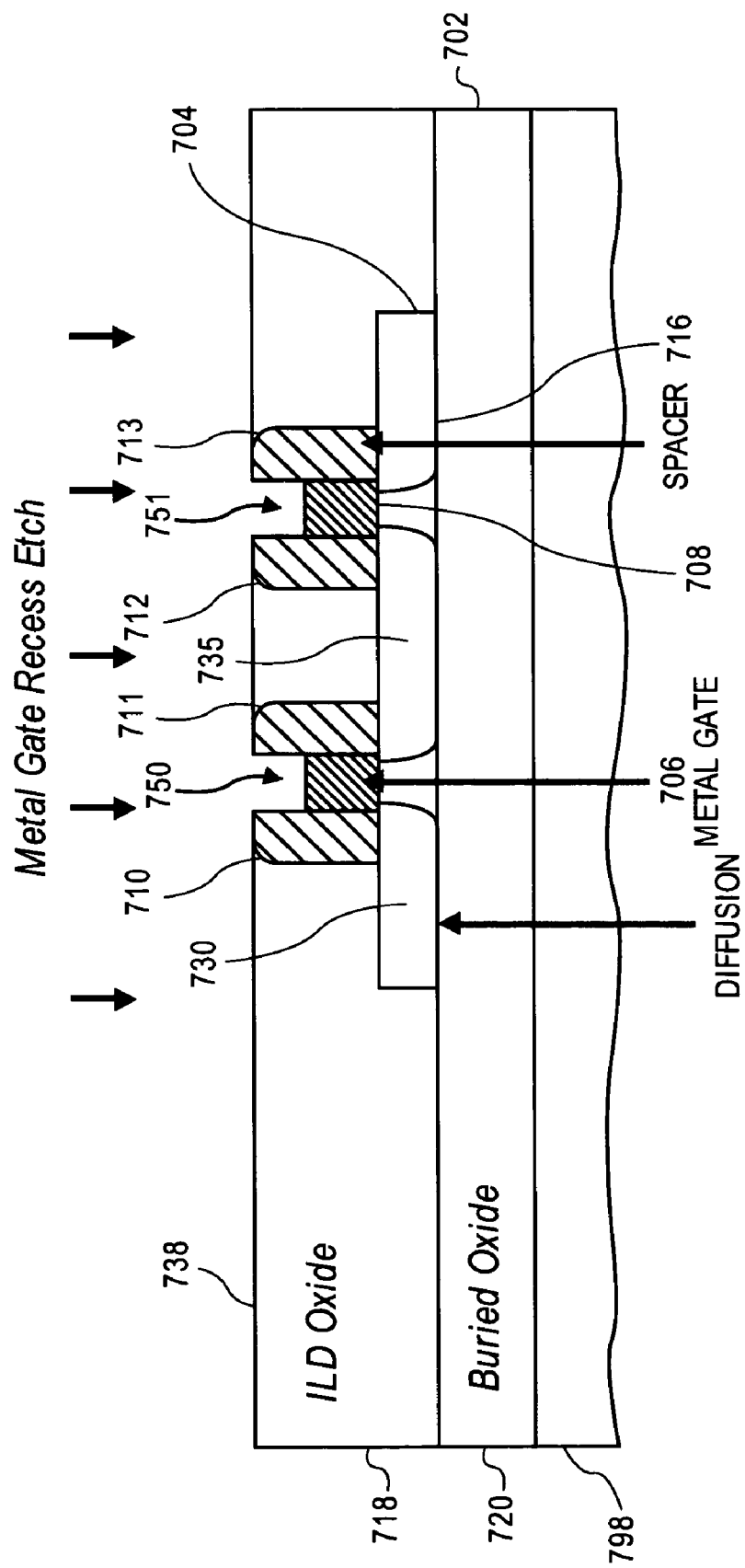
FIG. 17 is a cross section of a wafer with a transistor structure after a metal gate recess etch.

FIGS. 17 through 23 show wafer cross sections that illustrate operations in connection with the gate-protect option with respect to forming self-aligned contacts. FIG. 17 shows a cross section of wafer 702 that includes a buried oxide layer 720 above a silicon substrate 798. Buried oxide layer 720 is covered by an interlayer dielectric oxide layer 718. The interlayer dielectric oxide layer 718 includes diffusion layer 704 and metal gates 706 and 708 above the diffusion layer 704. Metal gate 706 has adjacent spacers 710 and 711. Metal gate 708 has adjacent spacers 712 and 713. Diffusion layer 704, gates 706 and 708, and spacers 710 though 713 form a transistor structure 716. The transistor structure 716 includes a pair of transistors with drain regions 730 and 731 and source region 735.

The gate-protect operations begin as follows. A metal gate recess etch is done with a selective etch. For example, aluminum gates 706 and 708 can be etched using a chlorine dry etch without attacking the silicon oxide of ILD oxide layer 718. The selective etch is needed given that modern transistors typically have a short gate length, which is not possible to align to given the lithography capabilities. The recesses 750 and 751 that result from the selective etch are shown in FIG. 17. If the gate and fill metals are different, then a different dry etch can be used, or a combination of a dry etch and wet etch can be used, to remove metals completely in the open regions 750 and 751.

Figure 18:
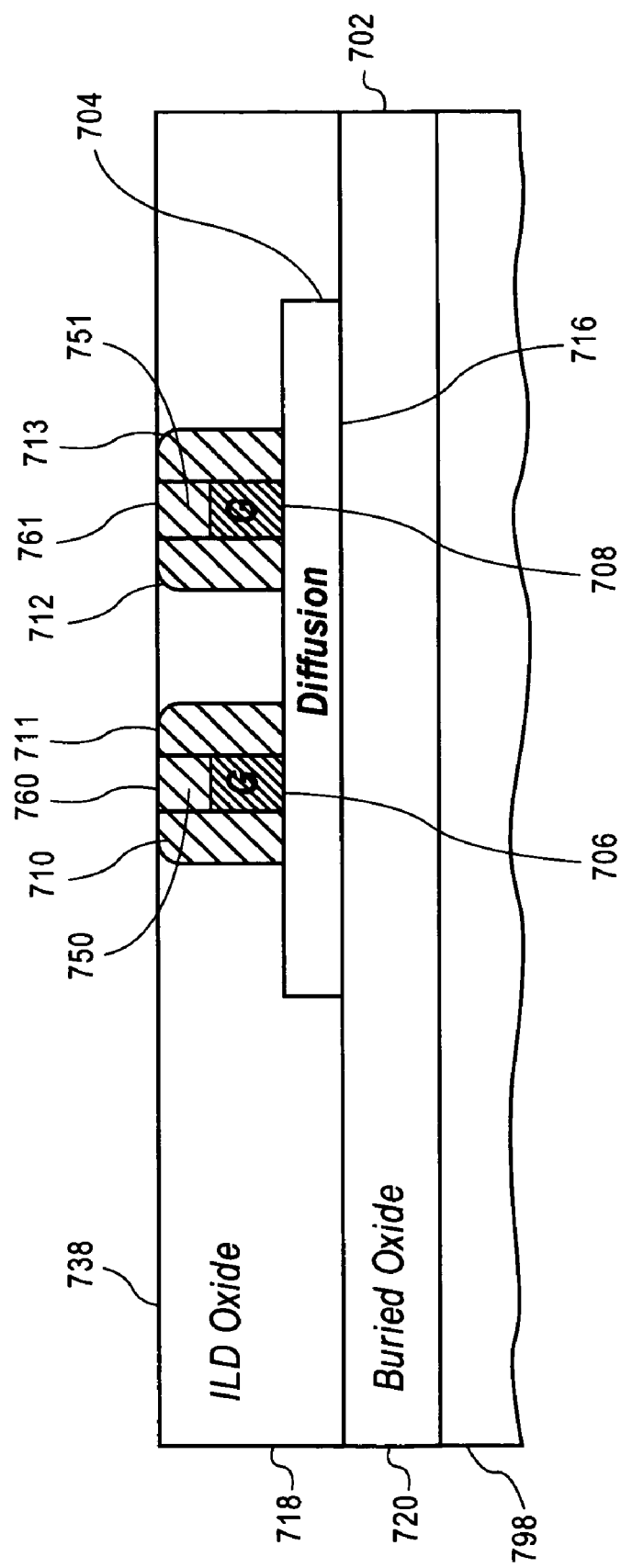
FIG. 18 is a cross section of the wafer after silicon nitride deposition and planarization.

FIG. 18 shows a cross section of wafer 702 after the deposition of silicon nitride ("SiN") in respective regions 750 and 751, forming caps 760 and 761 over respective metal gates 706 and 708.

Silicon nitride caps 760 and 761 are formed as follows. A silicon nitride layer is formed over the top 738 of wafer 702 by deposition. The silicon nitride fills openings 750 and 751, as well as forming a layer over top 738 of wafer 702. The silicon nitride layer (not shown) is then planarized by polishing the top of wafer 702. The polishing is done down to the top 738 of wafer 702. The result is that no silicon nitride is left on the top of wafer 702 except for the silicon nitride caps 760 and 761 filling recesses 750 and 751 over respective metal gates 706 and 708. The silicon nitride caps 760 and 761 act as protection for respective gates 706 and 708. For an alternative embodiment, a dry etch may be used for planarization instead of a polish.

Figure 19:
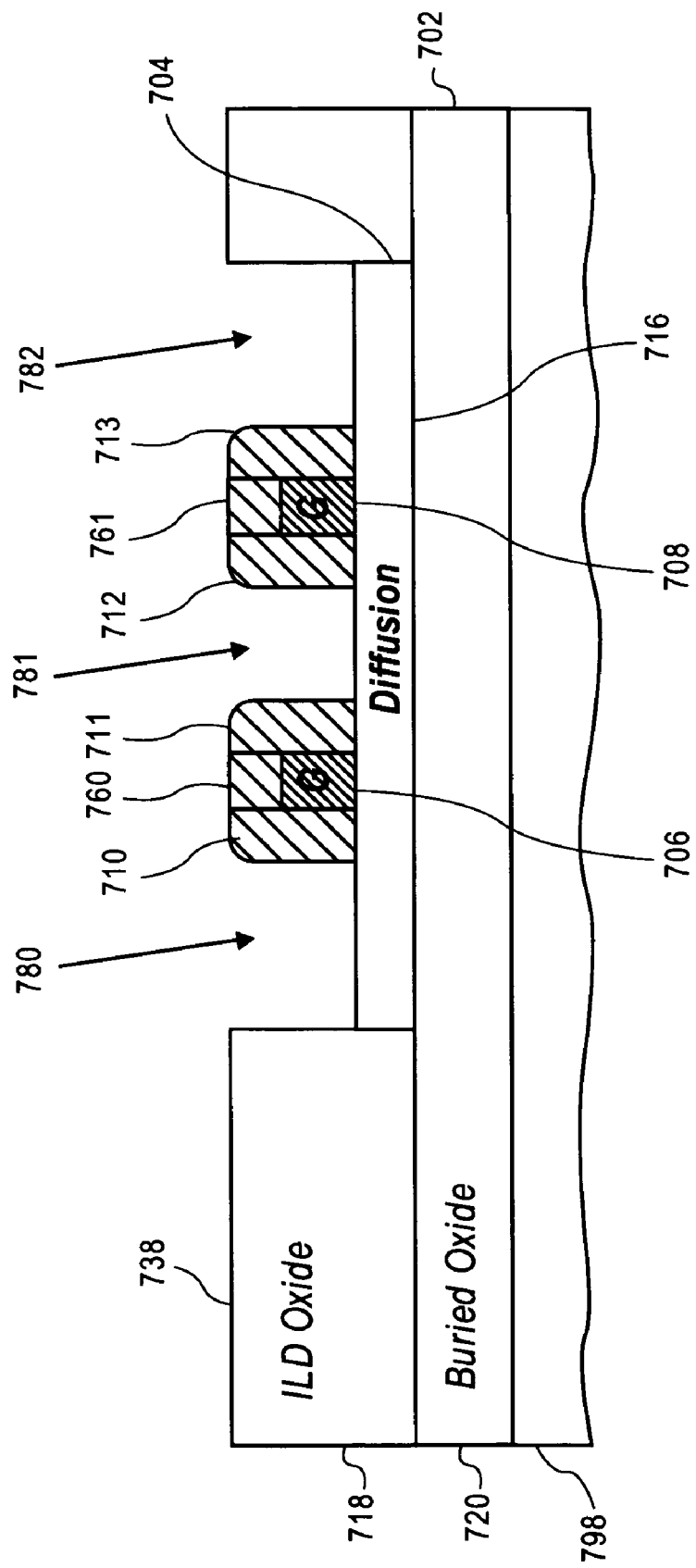
FIG. 19 is a cross section of the wafer with protected gates after a self-aligned contact etch and after photoresist removal.

FIG. 19 shows a cross section of wafer 702 after a self-aligned contact etch is done from the top of wafer 702. The etch forms open areas 780, 781, and 782 adjacent to respective spacers 710 though 713. The self-aligned contact etch used to form open areas 780 though 782 in FIG. 19 is similar to the self-aligned contact etch discussed in connection with wafer 102 in FIG. 6. The operations involved in that etch are as follows. A photoresist layer is applied to the top 738 of wafer 702. The photoresist layer is patterned to create an opening above areas 780, 781, and 782, as well as above spacers 710 through 713 and silicon nitride caps 760 and 761. After the etch, the photoresist layer is removed. The resulting structure is shown in FIG. 19.

Figure 20:
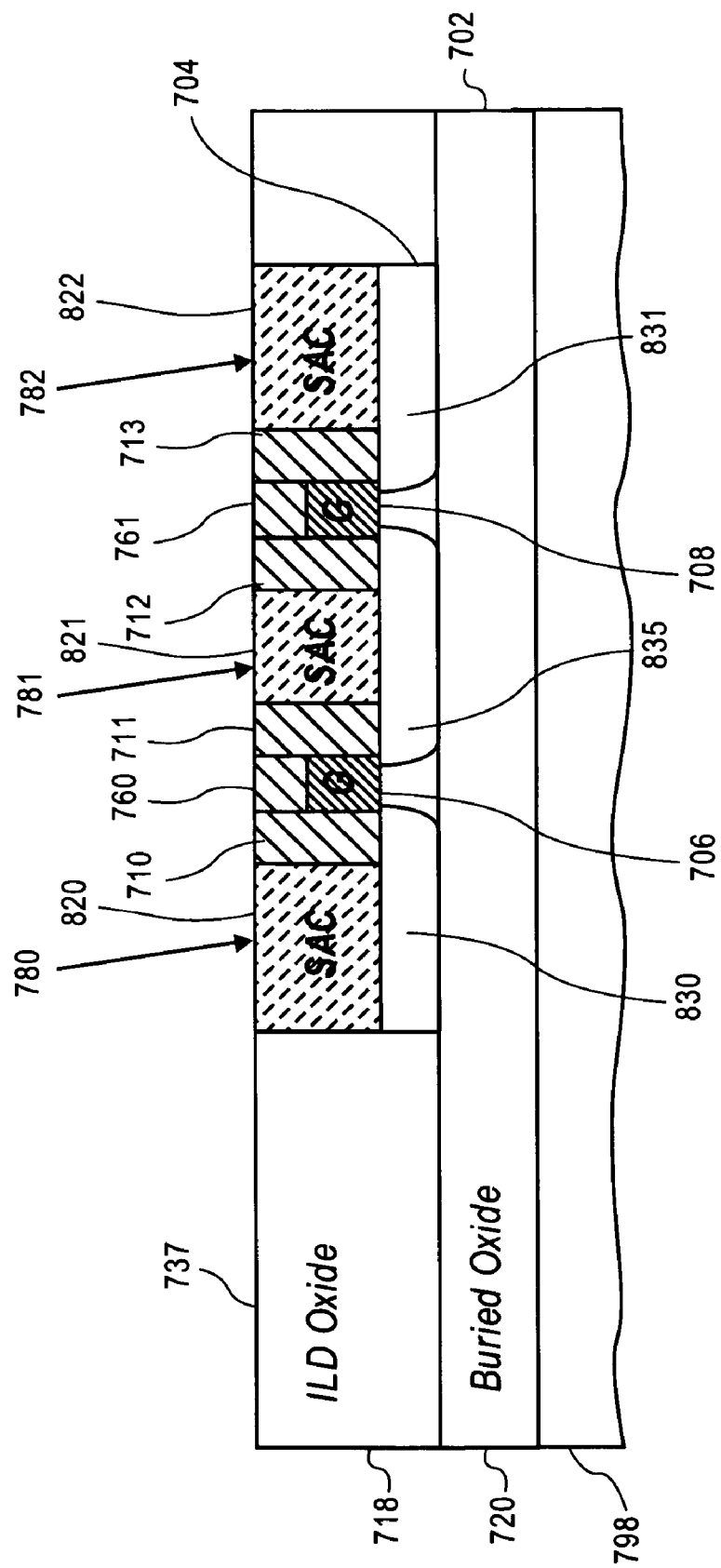
FIG. 20 is a cross section of the wafer with protected gates after contact metal deposition and planarization.

FIG. 20 shows a cross section of wafer 702 after the contact metal has been deposited and planarized to form self-aligned contact areas 820, 821, and 822 that provide contact up to the edges of respective spacers 710, 711, 712, and 713.

The process for depositing the contact metal to form contact areas 820, 821, and 822 is similar to the process shown in FIG. 9. Although not shown in FIG. 20, a layer of contact metal is deposited on top of surface 738 of wafer 702. The layer of contact metal resides above surface 738 and fills the openings 820, 821, and 822. A polishing operation—or, alternatively, an etch operation—is then performed to planarize the contact metal down to level 737 in order to form contact areas 820, 821, and 822. Level 737 is a level slightly below the original top level 738. The tops of spacers 710 through 713 and silicon nitride gate caps 760 and 761 are not covered by the contact metal after the planarization step is completed. Thus, the contact metal areas 820, 821, and 822 are not electrically interconnected with each other.

Contact metal area 820 resides above and contacts the drain region 830 of diffusion layer 704. Contact metal area 822 resides above and provides electrical contact to drain region 831 of diffusion area 704. Contact metal area 821 resides above and provides electrical contact to source region 835 of diffusion area 704.

Figure 21:
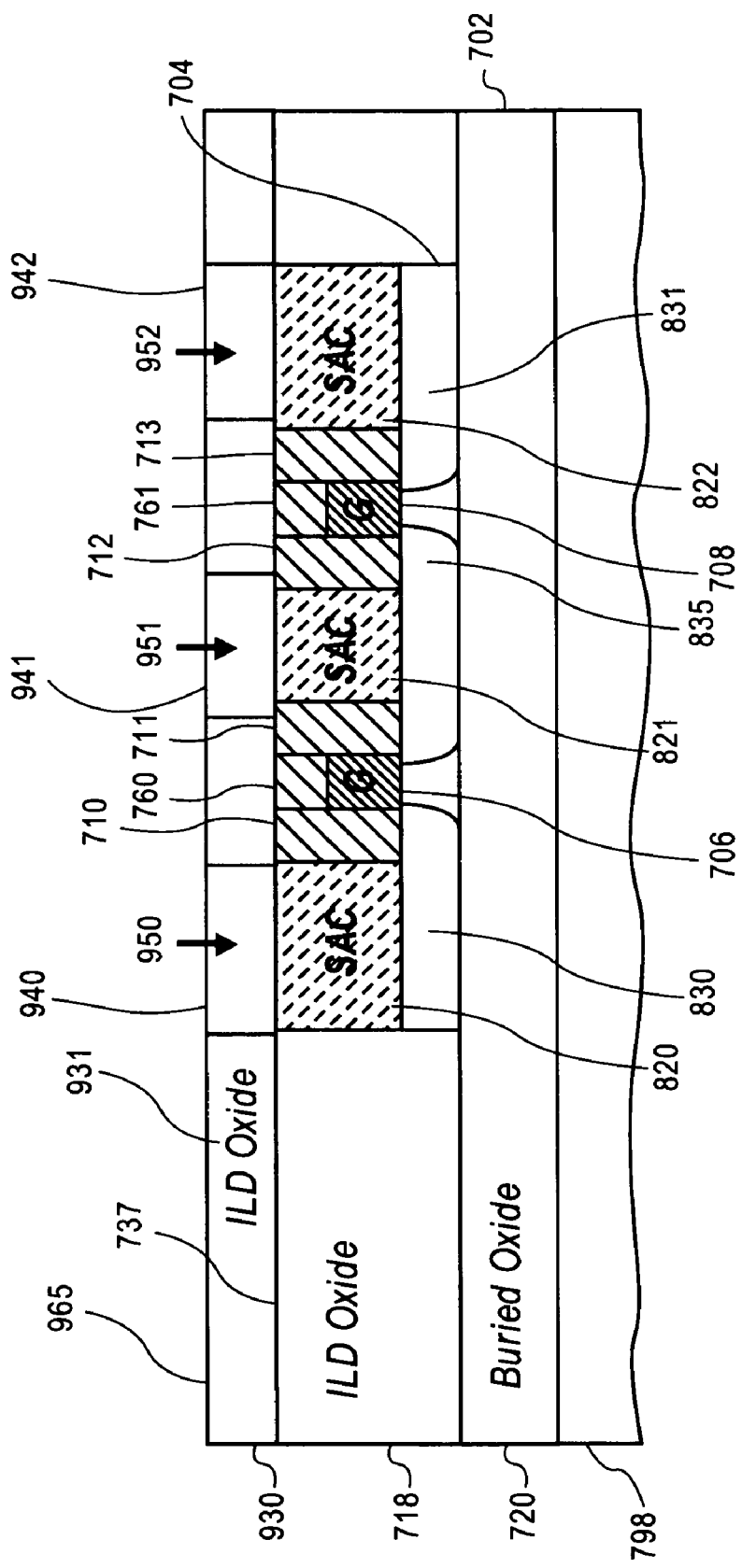
FIG. 21 is a cross section of the wafer with protected gates after deposition of a first metal layer.

FIG. 21 shows a cross section of wafer 702 with finished self-aligned contacts 820, 821, and 822 with a superadjacent metal one layer 930. The metal one layer 930 is formed by a metal damanscene process. An interlayer dielectric oxide material 931 is deposited on top 737 of wafer 702. A photoresist layer is then applied on top 965 of the ILD oxide layer 931. The photoresist layer is patterned to include openings above areas 940, 941, and 942. A wet or dry etch is then done from the top to form openings 940, 941, and 942 within interlayer dielectric oxide layer 931. The photoresist layer is then removed. A metal layer is then deposited on top 965 of wafer 702. The metal layer is comprised of contact metal that covers surface 965 and fills opening 940, 941, and 942. The metal layer is then planarized by polishing. The metal layer is removed from the top 965 of wafer 702, but the contact metal remains in openings 940, 941, and 942 to form respective metal lines 950, 951, and 952.

Metal line 950 resides on top of self-aligned contact 820. Metal line 950 thus provides electrical contact to drain region 830 of diffusion layer 704. Metal line 952 resides on top of self-aligned contact 822. Metal line 952 provides electrical contact to drain region 831 of diffusion layer 704. Metal line 951 resides above self-aligned contact metal 821. Metal line 951 provides electrical contact to source region 835 of diffusion region 704.

Because the metal gates 706 and 708 are protected by respective silicon nitride caps 760 and 761, the metal one layer 930—which typically has a looser line width control and alignment tolerance than a contact layer—can reside immediately above the self-aligned contacts 820, 821, and 822 without the use of an additional contact layer, such as contact layer 230 of FIG. 12.

Figure 22:
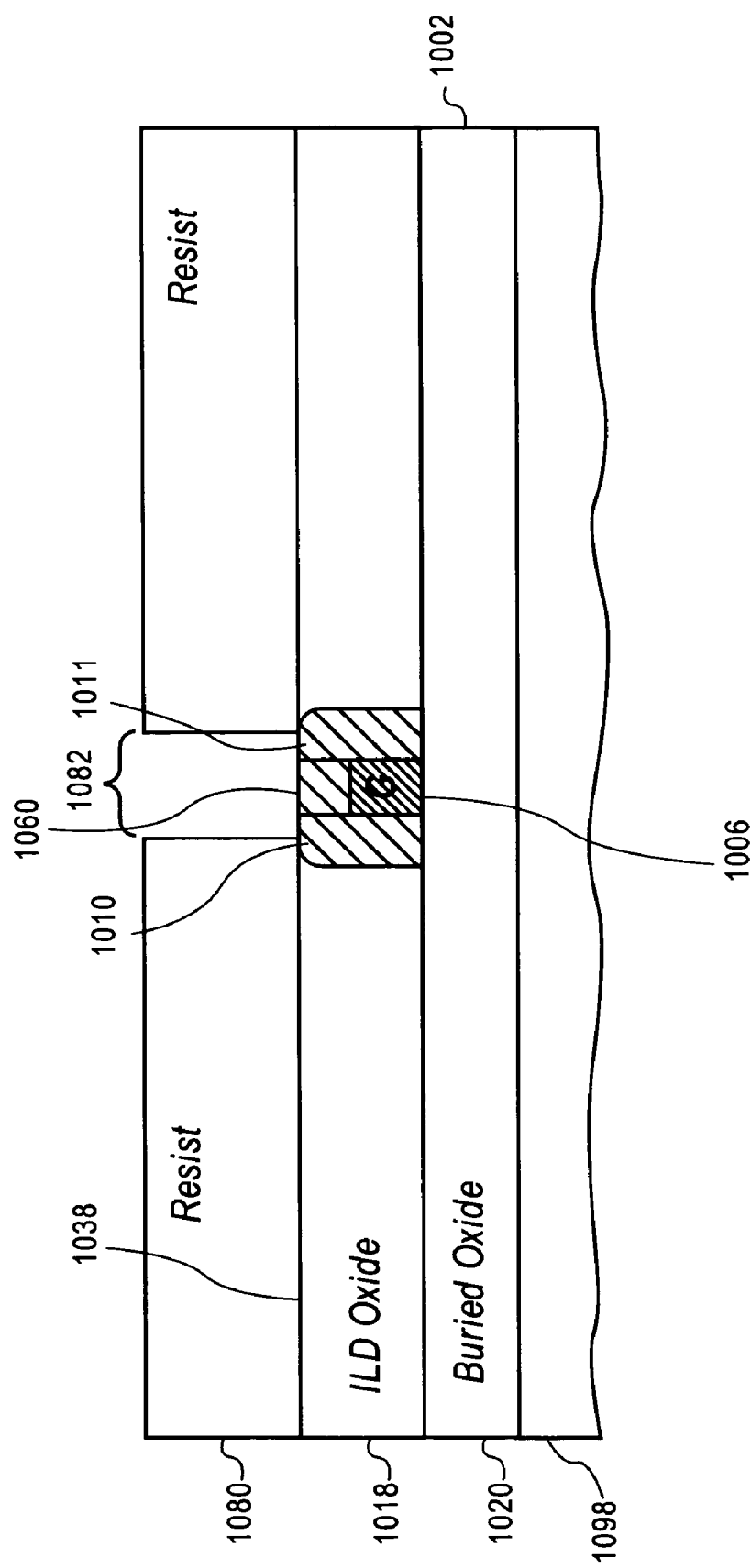
FIG. 22 is a cross section of the wafer with photoresist patterning prior to a gate contact etch.
Figure 23:
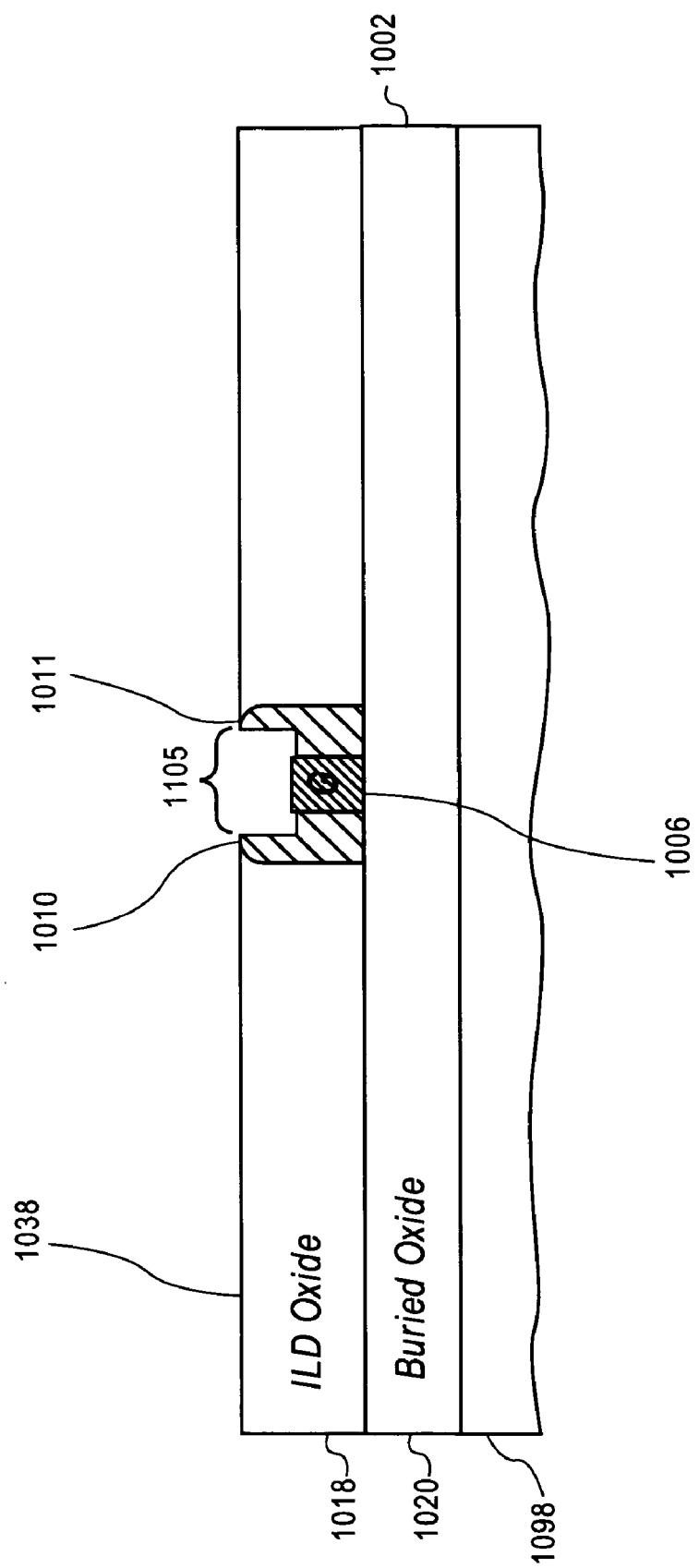
FIG. 23 is a cross section of the wafer after a gate contact etch and after photoresist removal.

FIGS. 22 and 23 show cross sections of semiconductor wafer 1002 in connection with a gate contact patterning process with respect to a gate 1006 that is initially protected by a silicon nitride cap 1060. In other words, a gate contact is formed with respect to gate 1006. For the embodiment shown in FIGS. 22 and 23, the gate contact patterning process is done prior to the patterning of self-aligned contacts. For another embodiment, the gate contact patterning is done after self-aligned contact patterning is completed.

As shown in FIG. 22, wafer 1002 includes a buried oxide layer 1020 above a silicon substrate 1098. The buried oxide layer 1020 resides below an interlayer dielectric oxide layer 1018. The interlayer dielectric oxide layer 1018 includes metal gate 1006 with silicon nitride cap 1060 and spacers 1010 and 1011.

A photoresist layer 1080 is deposited over top 1038 of wafer 1002. The photoresist layer 1080 is patterned such that an opening 1082 is formed above silicon nitride cap 1060 and partially above spacers 1010 and 1011.

A wet or dry etch is performed from above photoresist layer 1080. The wet or dry etch is resisted by photoresist layer 1080, but the wet or dry etch acts through opening 1082 to etch away the silicon nitride cap 1060 and portions of the upper regions of spacers 1010 and 1011. The type of wet or dry etch that is performed is one that can remove silicon nitride and that can partially etch away spacers 1010 and 1011.

The photoresist layer 1080 is then removed after the wet or dry etch. The result is shown in FIG. 23. A notch 1105 has been created above metal gate 1006. The opening or notch 1105 has been formed through a wet or dry etch by removing the silicon nitride cap 1060 in its entirety and by removing portions of spacers 1010 and 1011. The result is that the metal gate 1006 is exposed from the top without any protection layer. Thus, the gate protect has been removed from gate 1006.

The process used to deposit a metal gate contact in notch 1105 of FIG. 23 is similar to the metal deposition and planarization processes described above in connection with FIGS. 9 and 20. The formation of a metal gate contact in notch 1105 can be done at the same time that metal contacts to a diffusion layer (not shown) are formed for other transistors (not shown) on wafer 1002. Alternatively, the gate contact may be formed at the same time the metal one layer is formed. This approach can result in a higher aspect ratio for etch and metal deposition.

In subsequent processing operations, a metal one layer can be formed above layer 1018 of silicon wafer 1002. The superadjacent metal one layer can contain metal lines or contacts that contact the metallic gate contact formed within opening 1105.

Figure 24:
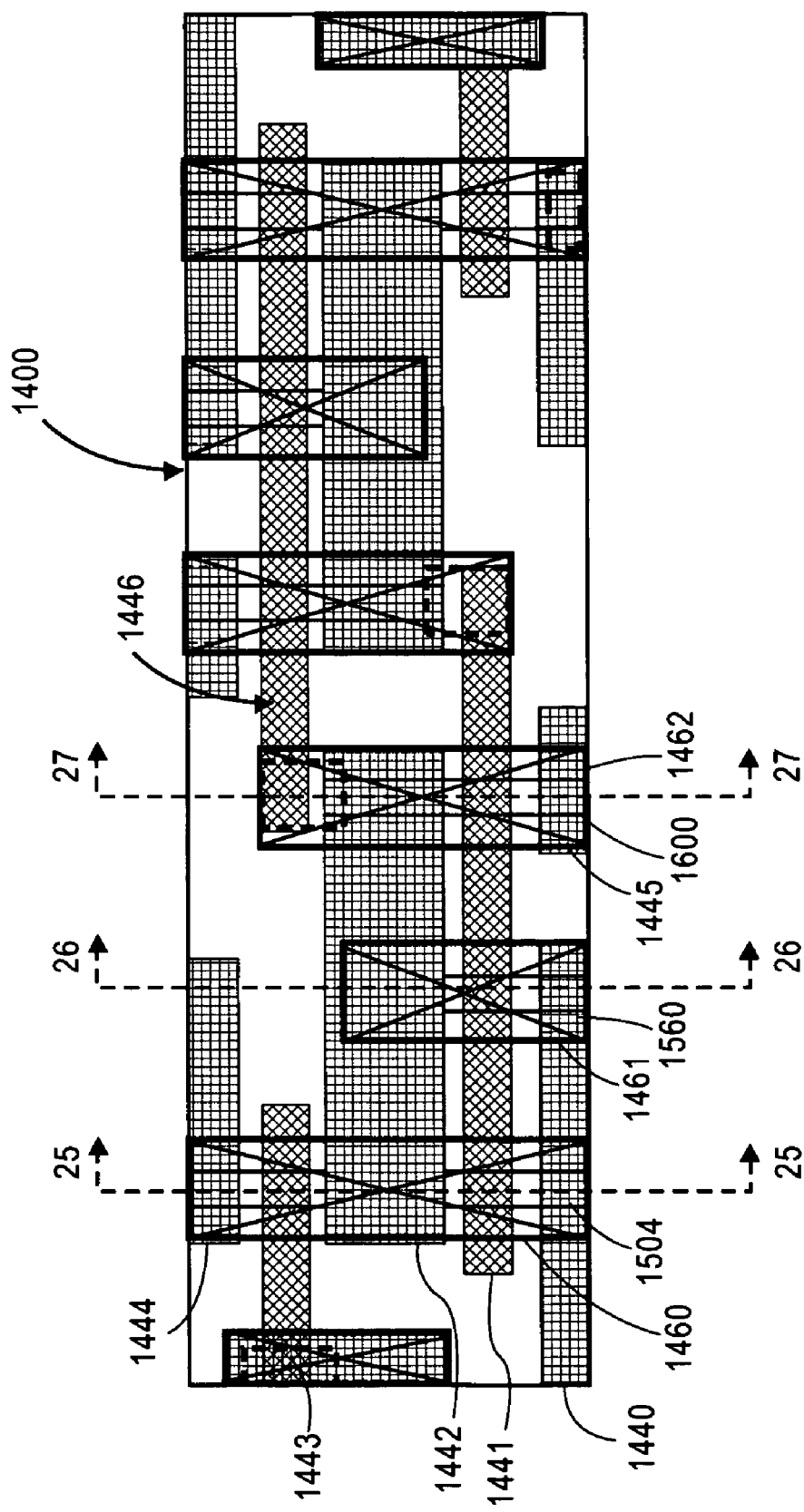
FIG. 24 is a layout up to the first metal layer of an SRAM with transistors having protected gates and self-aligned contacts.
Figure 25:
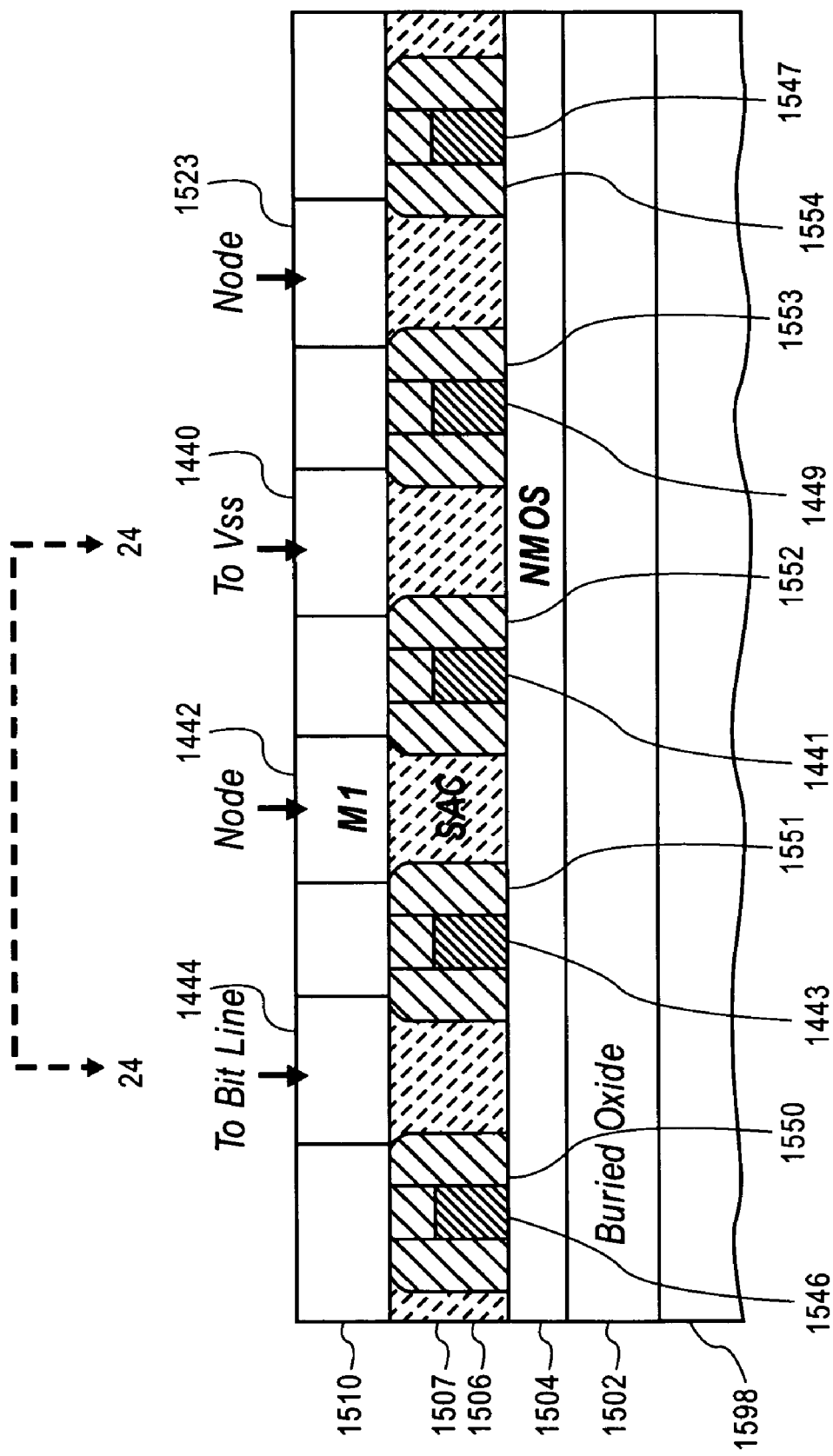
FIGS. 25-27 are cross sections of the SRAM of FIG. 24.
Figure 26:
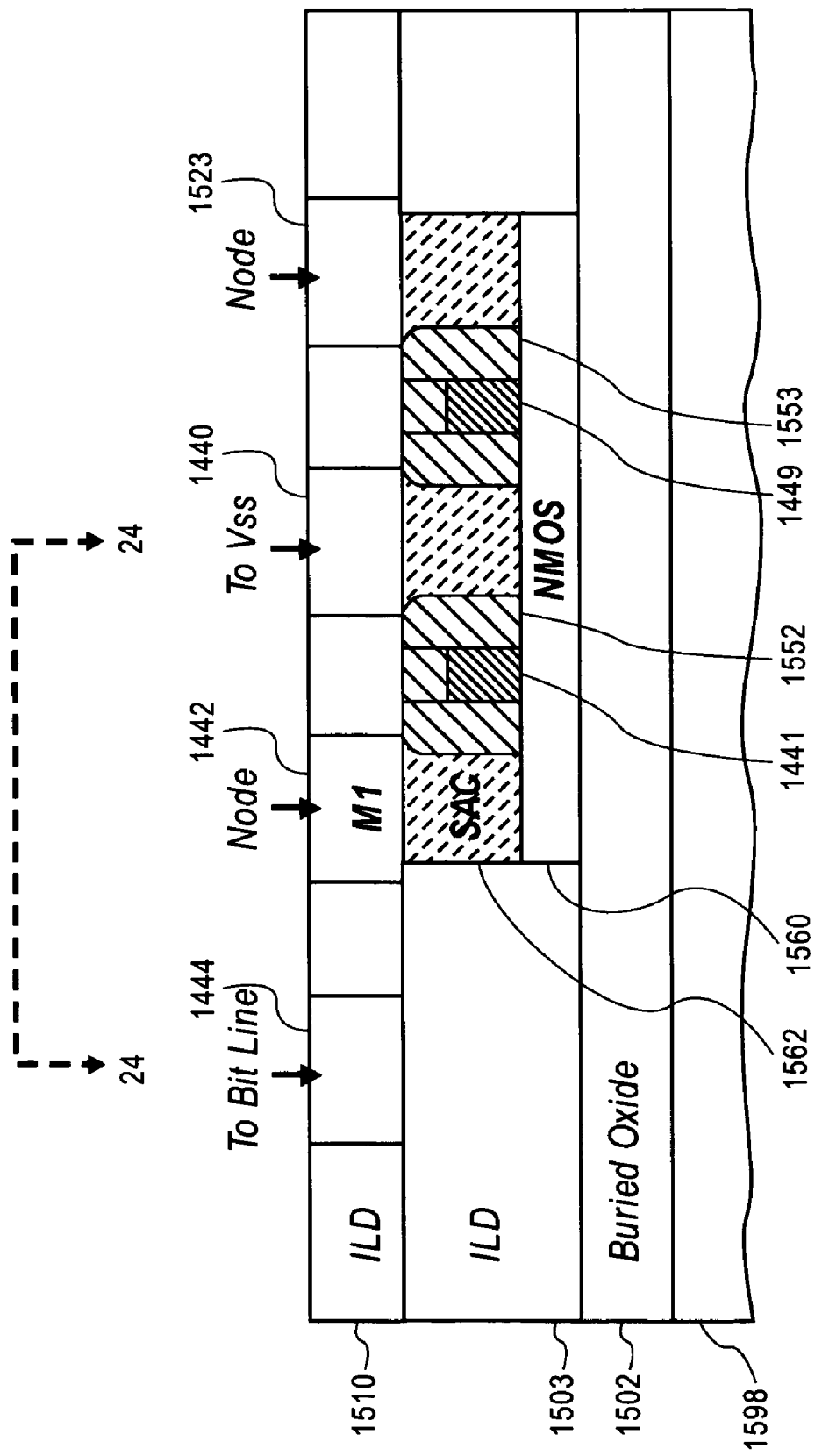
Figure 27:
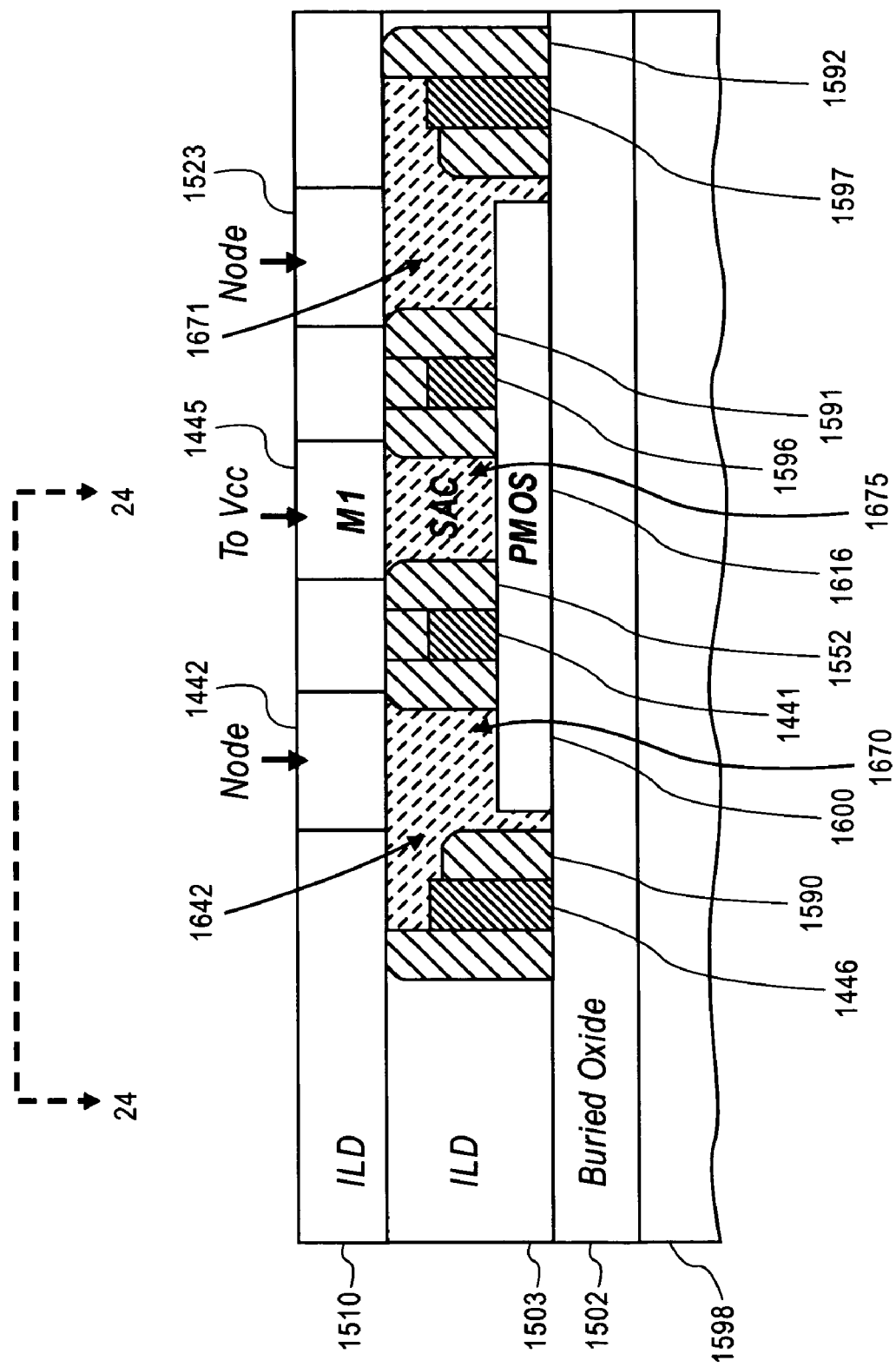

FIG. 24 is a top view of a layout 1400 of an SRAM containing transistor structures with gate-protected self-aligned contacts. The SRAM layout 1400 is illustrated up through the metal one layer. Layout 1400 in FIG. 24 shows only one cell. The actual cell array for the SRAM has more cells. Cross sections of the SRAM layout 1400 are shown in FIGS. 25, 26, and 27. Each of the cross sections shown in FIGS. 25-27 is for multiple cells. Thus, each of the cross sections of FIGS. 25-27 extends beyond the one-cell layout 1400 shown in FIG. 24.

The SRAM layout includes transistors with self-aligned contact openings 1460, 1461 and 1462, which include self-aligned contacts. Metal one line 1440 is coupled to Vss. Metal one line 1442 is a node. Metal one line 1444 is connected to a bit line. Metal one line 1445 is coupled to Vcc. Structures 1441, 1443, and 1446 are gates. An NMOS diffusion area 1504 resides under self-aligned contact opening 1460. An NMOS diffusion area 1560 resides underneath self-aligned contact opening 1461. A PMOS diffusion area resides underneath self-aligned contact opening 1462.

As shown in FIG. 25, the self-aligned contacts 1506 are immediately above an NMOS layer 1504. As shown in FIG. 26, the self-aligned contacts 1562 are superadjacent to and contact the NMOS layer 1560. As shown in FIG. 27, the self-aligned contacts 1642 are both above and adjacent to the PMOS layer 1600.

As shown in FIG. 25, the NMOS layer 1504 resides above the buried oxide layer 1502. Buried oxide layer 1502 resides above silicon substrate 1598. Layer 1507 includes the self-aligned contacts 1506 and the gate and spacer structures 1550 through 1554. Structures 1550-1554 include respective gates 1546, 1443, 1441, 1449, and 1547. Metal one layer 1510 resides above layer 1507 and self-aligned contacts 1506. The metal one layer includes metal lines 1444, 1442, 1440, and 1523 that reside above and contact respective self-aligned contacts of contacts 1506. Metal line 1444 is connected to the bit line for the SRAM. Metal line 1442 is connected to an internal node. Metal line 1440 is coupled to Vss. Metal line 1523 is connected to an internal node.

As shown in FIG. 26, interlayer dielectric layer 1503 resides above buried oxide layer 1502. The interlayer dielectric layer 1503 includes gate structures 1552 and 1553 that include respective metal gates 1441 and 1449 with silicon oxide caps and spacers. The gate structures 1552 and 1553 reside above the NMOS diffusion layer 1560. Self-aligned contacts 1562 reside above the NMOS layer 1560 and are adjacent to respective gate structures 1552 and 1553. A metal one layer 1510 resides above the interlayer dielectric layer 1503. The metal one layer 1510 includes an interlayer dielectric with openings containing metal lines 1444, 1442, 1440, and 1523. Metal line 1444 is connected a bit line. Metal lines 1442, 1440, and 1523 reside above and contact respective self-aligned contacts 1562. Metal line 1442 is coupled to a node. Metal line 1440 is coupled to Vss. Metal line 1523 is coupled to a node. If there were alignment errors, then the metal one layer 1510 could short to the gates of gate structures 1550-1554 if those gates were not protected by the silicon nitride caps above those respective gates. In FIG. 26, however, no alignment error is shown.

As shown in FIG. 27, an interlayer dielectric layer 1503 resides above the buried oxide layer 1502. The interlayer dielectric layer 1503 includes the transistor structure 1616. The transistor structure 1616 includes gate structures 1552 and 1590-1592. The transistor structure also includes PMOS layer 1600 and self-aligned contacts 1642. The gate structures 1552 and 1591 include spacers along with silicon nitride caps for the respective gates 1441 and 1596. Gate structures 1590 and 1592 include respective gates 1446 and 1597. Gate structures 1590 and 1592 do not include silicon nitride caps. For gate structures 1590 and 1592, each of the respective self-aligned contacts 1670 and 1671 acts as a merged contact that contacts the respective gate as well as the adjacent PMOS diffusion region 1600. Thus, contact 1670 contacts gate 1446 and PMOS region 1600. Contact 1671 contacts gate 1597 and PMOS region 1600.

Metal one layer 1510 resides immediately above layer 1503. The metal one layer 1510 includes an interlayer dielectric that includes openings containing the metal lines 1442, 1445, and 1523. Metal lines 1442, 1445, and 1523 contact respective self-aligned contacts 1642. Metal line 1442 is coupled to a node. Metal line 1445 is coupled to Vcc. Metal line 1523 is coupled to a node. Metal lines 1442 and 1523 provide contacts to respective gates 1446 and 1597. Metal line 1445 provides electrical contact to the PMOS diffusion layer 1600 via self-aligned contact 1675.

Embodiments of the invention have been described in detail with respect to transistors on SOI with metal gates. A metal gate can be fabricated from various types of metals, including copper, aluminum, titanium, etc. Alternative embodiments of the invention can be used with other types of transistors with metal gates, such as trigate transistors and transistors on bulk silicon substrates. Embodiments of the invention can be used with a transistor having a gate with a protection layer, such as a silicon nitride protection layer. If there is a silicon nitride protective layer, the transistor can have a gate fabricated from various materials, including metal and polysilicon.

Alternative embodiments of the invention can be used with nanowire devices. Embodiments of the invention are applicable to nanowire devices as long as they have a transistor structure with a gate and spacer similar to the silicon transistors described herein. The nanowire devices can be made of various materials, such as silicon or carbon nanotudes.

Embodiments of the invention can involve the fabrication of rectangular self-aligned contacts in the direction of the diffusion region. Shorting is avoided by isolation of the self-aligned contacts through the polishing process.

In the foregoing specification, specific exemplary embodiments of the invention have been described. It will, however, be evident that various modifications and changes may be made thereto. The specification and drawings are, accordingly, to be regarded in an illustrative rather than a restrictive sense.

What is claimed is:

1. A method comprising:
    patterning an etch-resistant material to create an opening that resides above a transistor gate structure and above areas adjacent to the transistor gate structure, wherein the transistor gate structure comprises a metal transistor gate and spacers adjacent to the metal transistor gate, wherein a top, metal portion of the transistor gate is exposed by the opening;
    performing a selective etch through the opening that does not etch the transistor gate structure but does etch material that resides laterally with respect to the transistor gate structure in order to expose tops, immediately adjacent to the transistor gate structure, of drain and source regions of a diffusion layer of the transistor;
    depositing conductive material that covers respective tops of the drain and source regions of the diffusion layer of the transistor to a depth that does not short the drain and source regions of the diffusion layer of the transistor;
    forming a layer above the conductive material;
    forming, through the layer above the conductive material, contacts to respective portions of the conductive material that cover respective tops of the drain and source regions of the diffusion layer of the transistor.

2. The method of claim 1, wherein the transistor gate structure comprises a plurality of spaced transistor gates with respective adjacent spacers.

3. The method of claim 1, further comprising forming, through the layer above the conductive material, a contact to the gate of the transistor.

4. The method of claim 1, further comprising forming metal lines that contact respective tops of the contacts.

5. The method of claim 1, wherein the transistor is a trigate transistor.

6. The method of claim 1, wherein the spacers are comprised of silicon nitride.

7. The method of claim 1, wherein depositing conductive material comprises;
    depositing contact metal;
    polishing the contact metal until the contact metal is planarized with respect to a top of transistor gate structure.

8. The method of claim 1, wherein forming contacts to respective portions of the conductive material comprises:
    patterning photoresist on the layer above the conductive material;
    etching (1) a first via through the layer above the conductive material to a portion of the conductive material that covers the top of the drain region of the diffusion layer of the transistor and (2) a second via through the layer above the conductive material to a portion of the conductive material that covers the top of the source region of the diffusion layer of the transistor;
    depositing contact metal within the first and second vias.

9. A method comprising:
    polishing a wafer that includes a gate, spacers adjacent to the gate, and a diffusion layer with drain and source regions, wherein the polishing stops at a top of the spacers, wherein a top, conductive portion of the gate is exposed by the polishing;
    removing an upper portion of the gate so that a top of the gate is recessed with respect to the top of the spacers such that a gate recess is formed;
    filling the gate with a protective material;
    patterning an etch-resistant material to create an opening that resides (1) above the spacers, (2) above the protective material, and (3) above areas adjacent to the spacers;
    performing a selective etch through the opening that does not etch the gate, the protective material, or the spacers, but does etch material that resides laterally with respect to the spacers in order to expose tops, immediately adjacent to the spacers, of the drain and source regions of the diffusion layer;
    depositing conductive material that covers respective tops of the drain and source regions of the diffusion layer to a depth that does not short the drain and source regions of the diffusion layer;
    forming a layer above the conductive material;
    forming, in the layer above the conductive material, metal lines that contact respective portions of the conductive material that cover respective tops of the drain and source regions of the diffusion layer.

10. The method of claim 9, wherein the protective material is silicon nitride.

11. The method of claim 9, further comprising forming a contact to the gate of the transistor.

12. The method of claim 11, wherein forming a contact to the gate of transistor comprises:
    prior to performing a selective etch, removing the protective material from the gate recess and removing partial upper portions of the spacers in order to form a spacer recess;
    depositing contact material in the spacer recess;
    forming, in the layer above the conductive material, a metal line that contacts the conductive material in the spacer recess.

13. The method of claim 11, wherein forming a contact to the gate of the transistor comprises:

forming an opening in the layer above the conductive material that exposes a top of the spacers and the protective material filling the gate recess;

removing the protective material from the gate recess and removing partial upper portions of the spacers in order to form a spacer recess;

depositing contact material in the spacer recess;

filling the opening in the layer above the conductive material with a metal line that contacts the contact material in the spacer recess.

14. The method of claim 9, wherein the transistor is a trigate transistor.

15. The method of claim 9, wherein the transistor gate is comprised of metal and the spacers are comprised of silicon nitride.

16. The method of claim 9, wherein depositing conductive material comprises:

depositing contact metal;

polishing the contact metal until the contact metal is planarized with respect to a top of the spacers.

17. The method of claim 9, wherein forming metal lines comprises:

patterning photoresist on the layer above the conductive material;

etching a first opening in the layer above conductive material that exposes a top of the conductive material that covers the top of the drain region of the diffusion layer of the transistor;

etching a second opening in the layer above the conductive material that exposes a top of the conductive material that covers the top of the source region of the diffusion layer of the transistor;

depositing metal lines within the first and second openings.

* * * * *